US010442959B2

(12) United States Patent
Robinson et al.

(10) Patent No.: US 10,442,959 B2
(45) Date of Patent: Oct. 15, 2019

(54) PEELABLE ADHESIVE POLYMERIC FILM

(71) Applicant: DUPONT TEIJIN FILMS U.S. LIMITED PARTNERSHIP, Wilmington, DE (US)

(72) Inventors: Julian N. Robinson, North Yorkshire (GB); Jackie H. Symonds, North Yorkshire (GB); Duncan Mackerron, Cleveland (GB); Stephen W. Sankey, North Yorkshire (GB); Jamie Evans, Stockton-on-Tees (GB); Rachel Clare Little, Glasgow (GB)

(73) Assignee: DUPONT TEIJIN FILMS U.S. LIMITED PARTNERSHIP, Wilmington, DE (US)

( * ) Notice: Subject to any disclaimer, the term of this patent is extended or adjusted under 35 U.S.C. 154(b) by 0 days.

(21) Appl. No.: 15/570,766

(22) PCT Filed: Apr. 29, 2016

(86) PCT No.: PCT/GB2016/051236
§ 371 (c)(1),
(2) Date: Oct. 31, 2017

(87) PCT Pub. No.: WO2016/178002
PCT Pub. Date: Nov. 10, 2016

(65) Prior Publication Data
US 2018/0118980 A1    May 3, 2018

(30) Foreign Application Priority Data
May 1, 2015 (GB) .................................. 1507547.6

(51) Int. Cl.
| *C09J 7/25* | (2018.01) |
| *C09J 4/06* | (2006.01) |
| *C08G 18/08* | (2006.01) |
| *C09J 175/06* | (2006.01) |
| *C09J 175/16* | (2006.01) |
| *B32B 7/12* | (2006.01) |
| *B32B 9/04* | (2006.01) |
| *B32B 27/08* | (2006.01) |
| *B32B 27/20* | (2006.01) |
| *B32B 27/36* | (2006.01) |
| *B32B 37/00* | (2006.01) |
| *B32B 9/00* | (2006.01) |
| *B32B 17/10* | (2006.01) |
| *B32B 43/00* | (2006.01) |
| *C09J 129/04* | (2006.01) |
| *C09J 133/06* | (2006.01) |
| *C09J 175/04* | (2006.01) |
| *C09J 175/14* | (2006.01) |

(Continued)

(52) U.S. Cl.
CPC ................. *C09J 7/255* (2018.01); *B32B 7/12* (2013.01); *B32B 9/005* (2013.01); *B32B 9/045* (2013.01); *B32B 17/10779* (2013.01); *B32B 27/08* (2013.01); *B32B 27/20* (2013.01); *B32B 27/36* (2013.01); *B32B 37/025* (2013.01); *B32B 43/006* (2013.01); *C08G 18/0819* (2013.01); *C09J 4/06* (2013.01); *C09J 129/04* (2013.01); *C09J 133/06* (2013.01); *C09J 175/04* (2013.01); *C09J 175/06* (2013.01); *C09J 175/14* (2013.01); *C09J 175/16* (2013.01); *H01L 21/6835* (2013.01); *B32B 2255/10* (2013.01); *B32B 2255/26* (2013.01); *B32B 2264/102* (2013.01); *B32B 2264/104* (2013.01); *B32B 2307/41* (2013.01); *B32B 2307/518* (2013.01); *B32B 2307/536* (2013.01); *B32B 2307/732* (2013.01); *B32B 2307/746* (2013.01); *B32B 2309/02* (2013.01); *B32B 2309/04* (2013.01); *B32B 2457/14* (2013.01); *B32B 2457/20* (2013.01); *C08G 2170/80* (2013.01); *C09J 2203/326* (2013.01); *C09J 2429/00* (2013.01); *C09J 2433/00* (2013.01); *C09J 2475/00* (2013.01); *H01L 51/003* (2013.01); *H01L 51/0097* (2013.01); *H01L 2221/68386* (2013.01)

(58) Field of Classification Search
CPC ........................................................ C09J 7/255
See application file for complete search history.

(56) References Cited

U.S. PATENT DOCUMENTS

| 2004/0142176 A1* | 7/2004 | Wang ...................... B32B 27/08 428/412 |
| 2004/0234717 A1 | 11/2004 | Sheats et al. |
| 2007/0187719 A1 | 8/2007 | Yuan et al. |

(Continued)

FOREIGN PATENT DOCUMENTS

| CN | 102224214 A | 10/2011 |
| CN | 103249795 A | 8/2013 |

(Continued)

OTHER PUBLICATIONS

Bradley et al., "TGA-IR Analysis Using the OMNIC Mercury TGA Software", White Paper, 52352, 2012, 6 pages.

(Continued)

Primary Examiner — Daniel H Lee
(74) Attorney, Agent, or Firm — RatnerPrestia

(57) ABSTRACT

Peelable polymeric film, in particular, peelable polymeric film which comprises a polymeric substrate layer and a coating layer of adhesive, and which is of particular use in the manufacture of electronic devices is described. The adhesive layer is derived from an aqueous composition which comprises an aliphatic polyurethane and is switchable.

51 Claims, 24 Drawing Sheets

(51) Int. Cl.
*H01L 21/683* (2006.01)
*H01L 51/00* (2006.01)

(56) References Cited

U.S. PATENT DOCUMENTS

| | | |
|---|---|---|
| 2007/0267130 A1 | 11/2007 | Wang et al. |
| 2012/0021215 A1* | 1/2012 | Burch ................ C09J 7/21 428/354 |
| 2013/0017246 A1 | 1/2013 | Tunius |
| 2013/0344317 A1 | 12/2013 | Rouby et al. |

FOREIGN PATENT DOCUMENTS

| | | | |
|---|---|---|---|
| CN | 103738026 | A | 4/2014 |
| EP | 0408197 | A2 | 6/1990 |
| JP | 2004106515 | A | 4/2004 |
| JP | 2004107644 | A | 4/2004 |
| JP | 2006278822 | A | 10/2006 |
| JP | 2007169568 | A | 7/2007 |
| JP | 2009008859 | A | 1/2009 |
| KR | 20110119134 | A | 11/2011 |
| WO | 2010034998 | A1 | 4/2010 |
| WO | 2011113008 | A2 | 9/2011 |
| WO | 2011121303 | A1 | 10/2011 |

OTHER PUBLICATIONS

Mauna Loa Observatory, https://www.esrl.noaa.gov/gmd/ccgg/about/co2_measurements.html , Nov. 3, 2017, 8 pages.
Menczel et al., Thermal Analysis of Polymers, Wiley, ISBN 987-0-471-76917-0, Chapter 2, 2009, pp. 168-207.
International Search Report and Written Opinion for International Application No. PCT/GB2016/051236, dated Jul. 5, 2016, 7 pages.
Great Britain Search Report for GB Application No. 1507547.6, dated Oct. 28, 2015, 5 pages.
Hitchcock et al., "The dual-capillary method for modern-day viscometry", American Laboratory, Aug. 1994, 7 pages.
Galgoci et al., "Solvent-Free Urethane-Acrylic Hybrid Polymers for Coatings", JCT Coatings, Tech., 2005, pp. 28-36.

* cited by examiner

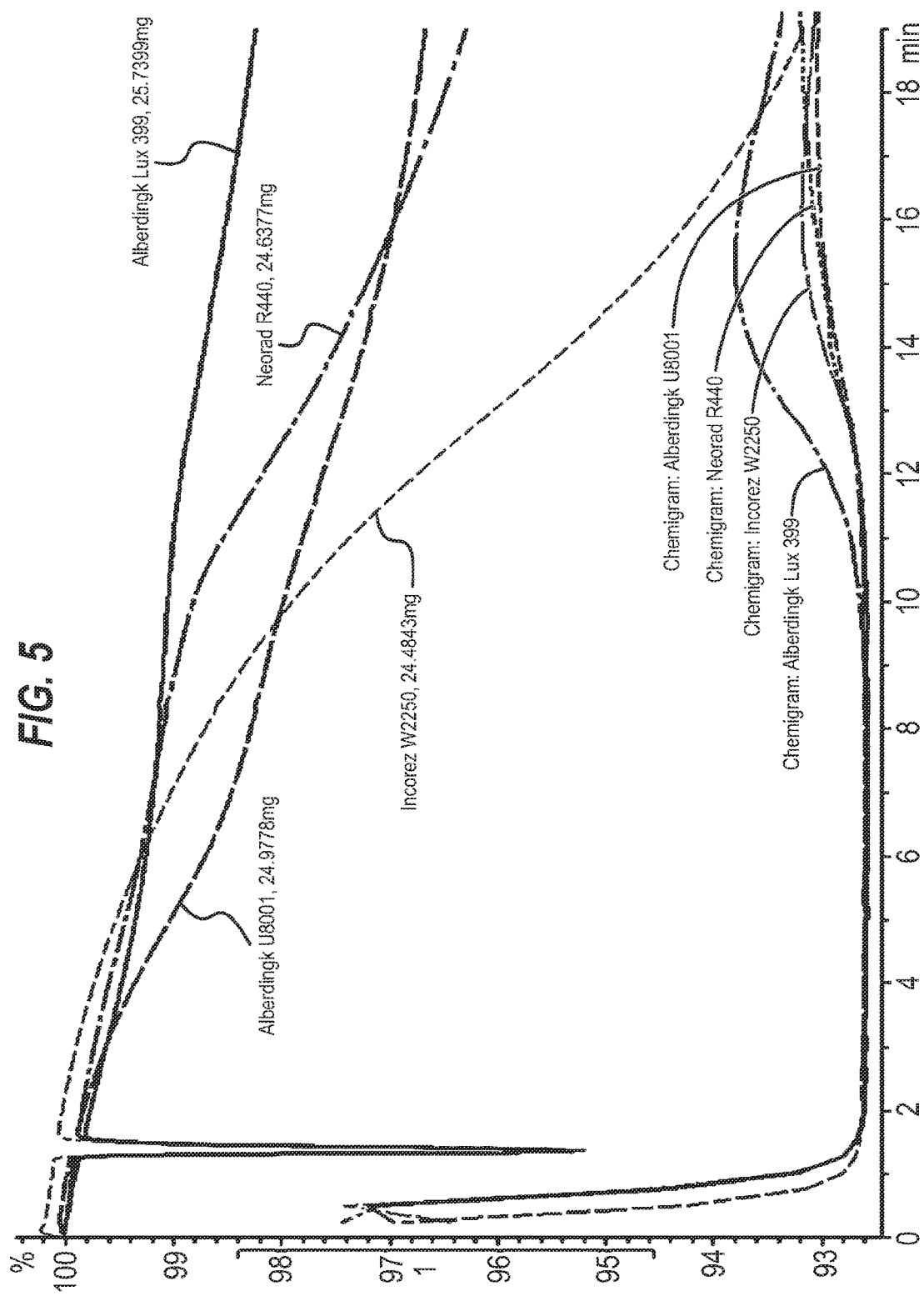

PEELABLE ADHESIVE POLYMERIC FILM

This applications a National Phase filing of International Application No. PCT/GB2016/051236, filed 29 Apr. 2016, and claims priority benefit of GB Application No. 1507547.6, filed 1 May 2015, the entirety of which applications is incorporated herein by reference for all purposes.

FIELD OF THE INVENTION

The present invention relates to a peelable adhesive polymeric film, in particular a peelable polymeric film comprising a polymeric substrate layer and a coating layer of adhesive. The peelable polymeric film is of particular use in the manufacture of electronic devices, particularly electronic displays.

BACKGROUND OF THE INVENTION

The advantageous mechanical properties, dimensional stability and optical properties of polyester films are well-known and are exploited in many areas of technology. Many adaptations of polyester films have been proposed in order to tailor the properties of a polyester film to a particular application. However, an adaptation which improves the performance of a polyester film in one respect may be detrimental to the performance of the film in another respect. For instance, a modification to improve the optical properties of a film may have a detrimental effect on the mechanical properties of the film. Accordingly, it is often difficult to obtain polyester films having a suitable combination of desirable properties.

One area in which polyester film has proved particularly useful is as a substrate in electronic display applications. In such applications, the substrates can be transparent, translucent or opaque, but are typically transparent. The substrates are usually required to meet stringent specifications for optical clarity, flatness and minimal birefringence. Typically, a total light transmission (TLT) of 85% over 400-800 nm coupled with a haze of less than 0.7% is desirable for displays applications. Surface smoothness and flatness are necessary to ensure the integrity of subsequently applied coatings. The substrates should also have good barrier properties, i.e. high resistance to gas and solvent permeation. The substrates should also exhibit chemical resistance. Mechanical properties such as flexibility, impact resistance, hardness and scratch resistance are also important considerations. A polymeric substrate should also exhibit good dimensional stability (for instance it should exhibit low shrinkage and low "curl") when subjected to the processing conditions, particularly elevated temperature, used in the manufacture of electronic display devices. Plastic substrates are of lighter weight than glass or quartz sheets of equal thickness, and flexible plastic substrates have the further advantage that they allow the printing of electronic components onto the substrate in a reel-to-reel process, which reduces cost and allows the manufacture of curved-surface devices.

A variety of techniques have been developed to manufacture electronic displays (or screens). Of particular interest are flexible rollable displays (or screens), which are finding applications in cell-phones and handheld or palm-top computers (also known as PDAs). The rollable display may be stored in rolled form and unrolled to full size when desired, and then connected to a cell-phone or PDA. Manufacture of such displays begins with a polymeric laminate, which is processed by the application of a succession of layers or coatings to produce the final display. In one such process, the polymeric laminate is adhered, by means of an adhesive composition, to a rigid base (typically a glass or silicon wafer) in order to hold the laminate secure and flat while some or all of the subsequent layers e.g. the electronics are applied thereto. Desirably, the adhesive composition should (i) be capable of adhering the polymeric laminate to the rigid base and retaining that adhesive bond throughout the subsequent processing; (ii) be chemically, mechanically and thermally resistant; and (iii) allow peeling of the processed laminate away from the rigid base with a clean peel, leaving the adhesive coating on the rigid base. Thus, after processing, the plane of failure of the adhesive bond should be at the polymeric laminate/adhesive interface, rather than within the adhesive layer itself or at the adhesive/rigid base interface. Such adhesive compositions are referred to herein as "switchable adhesives", which compositions may therefore be defined as exhibiting the essential feature of transferability between substrates which occurs as a consequence of a change in the plane of failure of the adhesive composition as a consequence of the processing to which the ensemble is subjected.

Thus, a switchable adhesive layer is one which is applied to a polymeric film substrate to form a laminate, which laminate is subsequently applied to a rigid substrate base such that the switchable adhesive layer is disposed adjacent the rigid base, wherein the switchable adhesive layer remains attached to the rigid base upon separation of the polymeric substrate from the rigid base, particularly wherein the rigid base is a glass or silicon wafer substrate and the polymeric film substrate comprises a polyester film.

To date, the use of such polyester materials in such a manufacturing process has been limited by the thermal stability of the adhesive composition. The currently used adhesive-coated films can be heated to temperatures of approximately 150° C. without any issues. While this was previously satisfactory, there is an increasing need to take processing temperatures higher than 150° C., which is a problem for conventionally used materials because they start to degrade and bubble at these higher temperatures. Bubbling is a problem in the manufacture of a smooth and even display.

Hence, there is a need for an adhesive-coated film which has the optical and mechanical properties to make it useful in the manufacture of electronic displays and which is also switchable but which can also withstand processing temperatures of greater than 150° C.

SUMMARY OF THE INVENTION

Against this background, the inventors have surprisingly identified adhesive coatings which can be applied to a polyester film substrate and which are both switchable and can withstand processing temperatures of greater than 150° C. Furthermore, the inventors have surprisingly identified essential features which adhesive compositions must satisfy in order to exhibit the required properties.

DETAILED DESCRIPTION OF THE INVENTION

Therefore, in a first aspect, the present invention provides a method for manufacturing an electronic device comprising:

(a) heating a laminate comprising (i) a polyester film substrate having a first surface and a second surface, (ii) an adhesive coating derived from an aqueous composition comprising an aliphatic polyurethane and (iii) a glass or silicon wafer substrate, wherein the adhesive coating is disposed between the polyester film substrate and the glass or silicon wafer substrate, to a temperature of at least 150° C. (typically 180° C. or greater, and preferably less than 220° C., preferably no more than 210° C., preferably no more than 200° C.) for a period of at least 2 minutes; and (b) peeling the polyester film substrate from the glass or silicon wafer substrate to leave the adhesive coating on the glass or silicon wafer substrate.

The method of the first aspect preferably further comprises the step of disposing one or more electronic components on the second surface of the polyester film substrate while said polyester film substrate is adhered by the adhesive coating to the glass or silicon wafer substrate and prior to the step of peeling the polyester film substrate from the glass or silicon wafer substrate.

Typically, the step of disposing one or more electronic components is conducted while the laminate is at a temperature of at least 150° C. (typically 180° C. or greater, and preferably less than 220° C., preferably no more than 210° C., preferably no more than 200° C.) for a period of at least 2 minutes.

Preferably, the method of the first aspect comprises the steps of:

(a) providing a polyester film comprising (i) a polyester film substrate having a first surface and a second surface and (ii) an adhesive coating derived from an aqueous composition comprising an aliphatic polyurethane wherein said adhesive coating is disposed on a first surface of said polyester film substrate;

(b) laminating a glass or silicon wafer substrate to the first surface of the polyester film substrate such that the adhesive coating is disposed between the polyester film substrate and the glass or silicon wafer substrate;

(c) processing the laminate by subjecting it to a temperature of at least 150° C. (typically 180° C. or greater, and preferably less than 220° C., preferably no more than 210° C., preferably no more than 200° C.) for a period of at least 2 minutes and disposing one or more electronic components on the second surface of the polyester film substrate; and (d) peeling the polyester film substrate from the glass or silicon wafer substrate to leave the adhesive coating on the glass or silicon wafer substrate.

It will be appreciated that following the step of peeling the polyester film substrate from the glass or silicon wafer substrate, the polyester film substrate is used as a substrate in the electronic device, i.e. it forms a component part of the electronic device.

After extensive research, the inventors have found that where the adhesive coating is derived from an aqueous composition which comprises an aliphatic polyurethane, it can withstand high processing temperatures without exhibiting the problematic bubbling which is seen with conventionally used adhesive coatings.

Advantageously, the adhesive is switchable in that, prior to the step of heating the laminate in the method according to the first aspect of the invention, the adhesion between the adhesive coating and the polyester film substrate is greater than the adhesion between the adhesive coating and the glass or silicon wafer substrate. However, after heating to a temperature of at least 150° C. (typically 180° C. or greater, and preferably less than 220° C., preferably no more than 210° C., preferably no more than 200° C.) for a period of at least 2 minutes, there is a change in the plane of failure of the adhesive composition such that it adheres more strongly to the glass or silicon wafer substrate than the polyester film substrate which means that the polyester film substrate can be peeled from the glass or silicon wafer substrate cleanly. Thus, the inventors have identified adhesives which exhibit switchable behaviour at high temperatures, which has widespread application in industrial fabrication processes, particularly in the manufacture of an electronic device.

As used herein, the term "heating . . . to a temperature of $T_1$ for a time period of $t_1$" means heating the article to a temperature $T_1$ and maintaining the article at the temperature $T_1$ for the time period $t_1$. It will be understood that the temperature $T_1$ is a temperature which is 150° C. or greater (typically 180° C. or greater, and preferably less than 220° C., preferably no more than 210° C., preferably no more than 200° C.). It will also be understood that the time period $t_1$ is a time period which is 2 minutes or greater.

In the methods described hereinabove, the laminate is preferably subjected to said elevated temperature for a period of no more than 2 hours, preferably no more than 1 hour. Thus, the time period $t_1$ is a time period which is preferably no more than 2 hours.

In the methods described hereinabove, the method may comprise one or more separate heating step(s).

The electronic devices to which this invention is particularly applicable are electronic display devices, particularly flexible such devices. The electronic devices include electroluminescent (EL) display devices (particularly organic light emitting display (OLED) devices), electrophoretic displays (e-paper), photovoltaic (PV) cells and semiconductor devices (such as organic field effect transistors, thin film transistors and integrated circuits generally), particularly flexible such devices.

As used herein, the term "electronic component" refers to the functional components of the electronic device which enable it to function as an electronic device. Such components are conventional in the art and well known to the skilled person, and include circuitry and circuit components, as well as conductive or semi-conductive layers from which circuitry and circuit components are fabricated.

The electronic devices suitably further comprise a barrier layer which is disposed on the polyester film substrate in order to protect the functional electronic layers of the electronic device from air and moisture. Thus, the barrier layer provides a barrier to water vapour and/or oxygen transmission, particularly such that the water vapour transmission rate of the composite film comprising the polyester film substrate and the barrier layer is less than $10^{-3} g/m^2/day$ and/or the oxygen transmission rate of the composite film comprising the polyester film substrate and the barrier layer is less than $10^{-3}/mL/m^2/day$. Preferably, the water vapour transmission rate is less than $10^{-4} g/m^2/day$, preferably less than $10^{-5} g/m^2/day$, preferably less than $10^{-6} g/m^2/day$. Preferably, the oxygen transmission rate is less than $10^{-4} g/m^2/day$, preferably less than $10^{-5} g/m^2/day$. The barrier layer is suitably applied to the second surface of the polyester film substrate prior to application of the electronic components. The barrier layer may be applied to the second surface of the polyester film substrate before or after the lamination of the polyester film substrate to the glass or silicon wafer, and in one embodiment is applied to the polyester film substrate before lamination of the polyester film substrate to the glass or silicon wafer. A barrier layer is typically applied in a sputtering process at elevated temperatures, and may be organic or inorganic. A barrier layer can itself comprise one or more discrete layers, and may comprise one or more organic layer(s) and one or more inorganic layer(s), but is preferably a single layer. Materials which are suitable for use to form a barrier layer are disclosed, for instance, in U.S. Pat. No. 6,198,217. Typical organic barrier layers include photocurable monomers or oligomers, or thermoplastic resins. Photocurable monomers or oligomers should have low volatility and high melting points. Examples of such monomers include trimethylol acrylates such as trimethylolpropane triacrylate, ditrimethylolpropane tetraacrylate and the like; long-chain acrylates such as 1,6-hexanediol diacrylate, 1,6-hexanediol dimethacrylate and the like; and cyclohexyl acrylates such as dicyclopentenyloxyethyl acrylate, dicyclopentenyloxy acrylate, cyclohexyl methacrylate and the like. Examples of such oligomers include acrylate oligomers, epoxy acrylate oligomers, urethane acrylate oligomers, ether acrylate oligomers, and the like. Photoinitiators, such as benzoin ethers, benzophenones, acetophenones, ketals and the like, may be used to cure the resin. Examples of suitable thermoplastic resins include polyethylene, polymethyl methacrylate, polyethylene terephthalate and the like. These organic materials are typically applied by vacuum deposition. Typical inorganic barrier layers are made of a material which exhibits low moisture permeability and is stable against moisture. Of particular interest are the oxides, nitrides and sulphides of Groups IVB, VB, VIB, IIIA, IIB, IVA, VA and VIA of the Periodic Table and combinations thereof. Examples include oxides such as $SiO_2$, SiO, GeO, $Al_2O_3$, ZnO, $ZrO_2$, $HfO_2$ and the like, nitrides such as AlN, TiN, $Si_3N_4$ and the like, and metals such as Al, Ag, Au, Pt, Ni and the like. Mixed oxide-nitrides may also be used. The inorganic material is usually applied using a vapour phase technique such as vacuum deposition, sputtering and the like under standard conditions. Where the polyester film substrate is used as a transparent substrate, the barrier layer must also exhibit optical transparency. The oxides noted above, as well as the nitrides of Si and Al are of particular utility here. The thickness of a barrier layer is preferably in the range of 2 nm to 100 nm, more preferably 2 to 50 nm. Thinner layers are more tolerant to flexing without causing the film to crack, which is an important property of flexible substrates since cracking compromises barrier properties. Thinner barrier films are also more transparent.

The polyester film substrate is a self-supporting film or sheet by which is meant a film or sheet capable of independent existence in the absence of a supporting base. Preferably, the polyester film is a biaxially oriented polyester film.

The term polyester as used herein refers to a polyester or copolyester derived from one or more diols, one or more aromatic dicarboxylic acids and optionally one or more aliphatic dicarboxylic acids having the general formula $C_nH_{2n}(CO_2H)_2$, wherein n is from 0 to 8.

The polyester film substrate is preferably a polyethylene terephthalate (PET) film or a polyethylene-2,6-naphthalate (PEN) film. The PET or PEN polyester may optionally comprise, as one or more comonomer(s), relatively minor amounts, preferably less than 20% by weight, less than 10% by weight or less than 5% by weight, of one or more residues derived from other dicarboxylic acids and/or diols. Other dicarboxylic acids include isophthalic acid, phthalic acid, 1,4-, 2,5-, or 2,7-naphthalenedicarboxylic acid, 4,4'-diphenyldicarboxylic acid, hexahydroterephthalic acid, 1,10-decanedicarboxylic acid and aliphatic dicarboxylic acids of the general formula $C_nH_{2n}(COOH)_2$ wherein n is 2 to 8, such as succinic acid, glutaric acid sebacic acid, adipic acid, azelaic acid, suberic acid or pimelic acid. Other diols include aliphatic and cycloaliphatic glycols, such as diethylene glycol, propylene glycol, dipropylene glycol, 1,3-propanediol, 1,4-butane diol and 1,4-cyclohexanedimethanol. Preferably the polyester contains only one dicarboxylic acid, i.e. terephthalic acid or 2,6-naphthalene dicarboxylic acid, preferably terephthalic acid. Preferably the polyester contains only one diol, i.e. ethylene glycol.

The intrinsic viscosity of the polyester is preferably at least about 0.60, preferably at least about 0.65, preferably at least about 0.70, preferably at least about 0.75, and preferably at least about 0.80. Preferably, the intrinsic viscosity of the polyester is not more than 0.85, preferably not more than 0.83. The use of polyesters with a relatively high intrinsic viscosity provides improved hydrolysis stability, although too high a viscosity can lead to difficulties in film manufacture and/or require specialised, more robust film-forming equipment. For instance, increasing the viscosity too greatly may mean that it is appropriate to reduce output (i.e. reduce the amount of PET extruded per unit time, which leads to a less economical process) or to increase the extrusion temperature in order to reduce the viscosity of the melt (which in turn can lead to thermal degradation of the polymer and the loss of associated properties) in order to achieve stable film production.

Formation of the polyester is conveniently effected in a known manner by condensation or ester interchange, generally at temperatures up to about 295° C. In a preferred embodiment, solid state polymerisation may be used to increase the intrinsic viscosity to the desired value, using conventional techniques well-known in the art, for instance using a fluidised bed such as a nitrogen fluidised bed or a vacuum fluidised bed using a rotary vacuum drier.

The polyester is the major component of the polyester film substrate, and makes up at least 50%, preferably at least 60%, more preferably at least 70%, and preferably at least 80% by weight of the total weight of the polyester film substrate. For example, the polyester may make up at least 85%, at least 90% or at least 95% by weight of the total weight of the polyester film substrate.

The polyester layer film substrate may further comprise any other additive conventionally employed in the manufacture of polyester films. Thus, additives such as UV absorbers, antioxidants, hydrolysis stabilisers, fillers, cross-linking agents, dyes, pigments, voiding agents, lubricants, radical scavengers, thermal stabilisers, flame retardants and inhibitors, anti-blocking agents, surface active agents, slip aids, gloss improvers, prodegradents, viscosity modifiers and dispersion stabilisers may be incorporated as appropriate. Such components may be introduced into the polymer in a conventional manner. For example, by mixing with the monomeric reactants from which the polyester is derived, or the components may be mixed with the polymer by tumble or dry blending or by compounding in an extruder, followed by cooling and, usually, comminution into granules or chips.

The polyester film substrate may comprise a particulate filler material. Particulate fillers are useful to improve handling and windability properties of polyesters films during manufacture. In the context of the present invention, the particulate filler is used in the polyester film substrate primarily to modulate its optical properties. The particulate filler is preferably a particulate inorganic filler, for example metal or metalloid oxides, such as alumina, titania, talc and silica (especially precipitated or diatomaceous silica and silica gels), calcined china clay and alkaline metal salts (such as the carbonates and sulphates of calcium and barium). The inorganic filler present should be finely-divided, and the volume distributed median particle diameter (equivalent spherical diameter corresponding to 50% of the volume of all the particles, read on the cumulative distribution curve relating volume % to the diameter of the particles—often referred to as the "D(v,0.5)" value) thereof is preferably in the range from 0.01 to 5 μm, more preferably 0.05 to 1.5 μm, and particularly 0.15 to 1.2 pm. Preferably at least 90%, more preferably at least 95% by volume of the inorganic filler particles are within the range of the volume distributed median particle diameter ±0.8 μm, and particularly ±0.5 μm. Particle size of the filler particles may be measured by electron microscope, coulter counter, sedimentation analysis and static or dynamic light scattering. Techniques based on laser light diffraction are preferred. The median particle size may be determined by plotting a cumulative distribution curve representing the percentage of particle volume below chosen particle sizes and measuring the 50th percentile.

Where present, the amount of particulate filler present in the polyester film substrate is preferably in the range of from about 0.1 to about 30% by weight, preferably in the range of from about 0.3 to about 30% by weight, preferably in the range of from about 2.0 to about 25% by weight, based on the weight of polyester in the layer, preferably at least about 3% by weight, and preferably no more than about 20% by weight. The amount of particulate filler depends, inter alia, on the identity of filler. Thus, where the particulate filler is selected from $BaSO_4$, the filler is preferably present in an amount of from 10% to about 20%, preferably from about 15% to about 20% by weight, based on the weight of polyester in the layer. Where the particulate filler is selected from $TiO_2$, the filler is preferably present in an amount of from 0.3% to about 15%, preferably from about 0.5% to about 10% by weight, preferably from about 1% to about 8%, preferably from about 3% to about 7%, based on the weight of polyester in the layer.

In one embodiment, the film described herein is optically clear, preferably having a % of scattered visible light (haze) of <3.5%, preferably <2%, more preferably <1.5%, more preferably ≤1%, and particularly less than 0.7%, measured according to the standard ASTM D 1003. In one embodiment, the haze is in the range of 0.6 to 1.0%. Preferably the total light transmission (TLT) in the range of 400-800 nm is at least 75%, preferably at least 80%, and more preferably at least 85%, measured according to the standard ASTM D 1003. In this embodiment, filler is typically present in only small amounts, generally not exceeding 0.5% and preferably less than 0.2% by weight of a given layer.

In an alternative embodiment, the film described herein has a % of scattered visible light (haze) in the range from 40 to 70%, preferably 60 to 70% measured according to the standard ASTM D 1003. Preferably the total light transmission (TLT) in the range of 400-800 nm is in the range from 70 to 85% measured according to the standard ASTM D1003. In this embodiment, the film promotes forward light scattering and so is useful in OLED applications.

In an alternative embodiment, the particulate filler may be used as an opacifying agent to increase the opacity of the polyester film substrate, such that the polyester film substrate is opaque and preferably exhibits a Transmission Optical Density (TOD) of at least 0.3, preferably at least 0.4, preferably at least 0.5, preferably at least 0.6, preferably at least 0.7, preferably at least 1.0 and preferably at least 1.5, and in one embodiment preferably at least 2.0, preferably at least 3.0, and preferably at least 4.0. In some embodiments, the particulate filler is selected such that the polyester film substrate is white, grey or black.

In one embodiment, the particulate filler is selected such that the polyester film substrate is an opaque white layer. Films according to this embodiment of the invention preferably exhibit a TOD in the range of at least about 0.3, preferably at least about 0.4, preferably at least 0.5, preferably at least 0.6, preferably at least 0.7, and typically no more than about 1.75. Preferred particulate fillers having a whitening effect include particulate inorganic fillers, preferably titanium dioxide and/or barium sulphate, and preferably either titanium dioxide or barium sulphate, and these are preferably present in the amounts described hereinabove. A white film preferably exhibits a whiteness index, measured as herein described, in the range of from about 60 to about 120 units.

In an alternative embodiment, the particulate filler is selected such that the polyester film substrate is an opaque grey or black layer. Films according to this embodiment of the invention typically exhibit a TOD of at least 2.0, more typically at least 3.0, more typically at least 4.0. Preferred particulate fillers having a darkening effect layer include carbon black and metallic fillers, such as aluminium powder. Carbon black is a preferred opacifying agent. In the case of a black or grey substrate layer, the amount of filler present in the polyester film substrate is typically in the range of from about 0.3% to about 10% by weight, preferably 0.5% to 7% by weight, particularly 1% to 5% by weight, and especially 2% to 4% by weight, based on the weight of the polyester in the layer. The opacifying agent suitably has a mean particle diameter in the range from 0.01 to 1.5 μm, particularly 0.02 to 0.05 μm.

In a further embodiment, polyester film substrate may comprise a combination of particulate fillers having a whitening effect with particulate fillers having a darkening effect. Suitable fillers are as described above, and the total amount of fillers in the polyester film substrate is preferably in the range of from 1% to 30% by weight, preferably 2% to 20% by weight, based on the weight of polyester in the layer. Films according to this embodiment of the invention typically exhibit a TOD of at least 1.0, more preferably at least 2.0 and more preferably at least 3.0.

Formation of the polyester film may be effected by conventional extrusion techniques well-known in the art. In general terms the process comprises the step of extruding polyester compositions through a die, usually at a temperature within the range of from about 280° C. to about 300° C., followed by quenching the extrudate and orienting the quenched extrudate.

Orientation may be effected by any process known in the art for producing an oriented film, for example a tubular or flat film process. The polyester film which forms the polyester film substrate in the present invention is preferably biaxially oriented. Biaxial orientation is effected by drawing in two mutually perpendicular directions in the plane of the film to achieve a satisfactory combination of mechanical and physical properties. In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation. In the preferred flat film process, the film-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature (Tg) of the polyester. Sequential orientation may be effected by stretching a flat, quenched extrudate firstly in one direction, usually the longitudinal direction, i.e.

the forward direction through the film stretching machine, and then in the transverse direction. Forward stretching of the extrudate is conveniently effected over a set of rotating rolls or between two pairs of nip rolls, transverse stretching then being effected in a stenter apparatus. Stretching is generally effected so that the dimension of the oriented film is from 2 to 5, more preferably 2.5 to 4.5 times its original dimension in the or each direction of stretching. Typically, stretching is effected at temperatures higher than the Tg of the polyester, preferably about 15° C. higher than the Tg. Greater draw ratios (for example, up to about 8 times) may be used if orientation in only one direction is required. It is not necessary to stretch equally in the machine and transverse directions although this is preferred if balanced properties are desired.

The stretched film may be, and preferably is, dimensionally stabilised by heat-setting under dimensional support at a temperature above the glass transition temperature of the polyester but below the melting temperature thereof, to induce the desired crystallisation of the polyester. The actual heat-setting temperature and time will vary depending on the composition of the film and its desired final thermal shrinkage but should not be selected so as to substantially degrade the toughness properties of the film such as tear resistance. During the heat-setting, a small amount of dimensional relaxation may be performed in the TD by a procedure known as "toe-in". Toe-in can involve dimensional shrinkage of the order 2% to 4% but an analogous dimensional relaxation in the MD is difficult to achieve since low line tensions are required and film control and winding becomes problematic.

The film may be further stabilized through use of an in-line relaxation stage. Alternatively the relaxation treatment can be performed off-line. In this additional step, the film is heated at a temperature lower than that of the heat-setting stage, and with a much reduced MD and TD tension. The tension experienced by the film is a low tension and typically less than 5 kg/m, preferably less than 3.5 kg/m, more preferably in the range of from 1 kg/m to about 2.5 kg/m, and typically in the range of 1.5 kg/m to 2 kg/m of film width. For a relaxation process which controls the film speed, the reduction in film speed (and therefore the strain relaxation) is typically in the range 0% to 2.5%, preferably 0.5% to 2.0%. There is no increase in the transverse dimension of the film during the heat-stabilisation step. The temperature to be used for the heat stabilisation step can vary depending on the desired combination of properties from the final film, with a higher temperature giving better, i.e. lower, residual shrinkage properties. A temperature of 135° C. to 250° C. is generally desirable, preferably 150° C. to 230° C., more preferably 170° C. to 200° C. The duration of heating will depend on the temperature used but is typically in the range of 10 to 40 seconds, with a duration of 20 to 30 seconds being preferred. This heat stabilisation process can be carried out by a variety of methods, including flat and vertical configurations and either "off-line" as a separate process step or "in-line" as a continuation of the film manufacturing process. Film thus processed will exhibit a smaller thermal shrinkage than that produced in the absence of such post heat-setting relaxation.

The polyester film substrate preferably has a thermal shrinkage after being held at a temperature of 150° C. for 30 minutes in the machine direction in the range from about 0.1% to 5%, preferably 0.3% to 1.5%. The polyester film substrate preferably has a thermal shrinkage after being held at a temperature of 150° C. for 30 minutes in the transverse direction in the range from 0% to about 5%, preferably 0.1% to 1.2%. In an alternative preferred embodiment, particularly wherein the polyester film substrate is a heat-stabilised film (as described herein), the thermal shrinkage of the film after being held at a temperature of 150° C. for 30 minutes is in the range from about 0.01% to 1%, preferably from 0.05% to 0.5% and more preferably no more than 0.10% in the machine direction, and preferably no more than 0.10% and more preferably no more than 0.05% in the transverse direction.

The thickness of the polyester film substrate is preferably in the range of from about 5 µm to about 500 µm. Preferably the thickness is no more than about 250 µm, more preferably no more than about 200 µm. Preferably the thickness is at least about 12 µm, more preferably at least about 15 µm, still more preferably at least about 20 µm, and typically at least about 25 µm.

The polyester film substrate described for the aspects of the invention herein may optionally be provided with a coating on the second surface thereof which aids winding and handling of the film, primarily during its manufacturing process. Such coatings are known in the art and sometimes referred to as "anti-blocking" or "slip" coatings. A suitable anti-blocking coating may be, for instance a discontinuous layer of an acrylic and/or methacrylic polymeric resin optionally further comprising a cross-linking agent, such as described in EP-A-0408197, the disclosure of which is incorporated herein by reference. Thus, where present, an anti-blocking coating is provided on the polyester film substrate on the surface which is opposite to the surface on which is disposed the adhesive coating described herein. The anti-blocking coating is preferably applied in-line during the manufacture of the polyester film substrate (i.e. wherein the coating step takes place during film manufacture and before, during or between any stretching operation(s) employed). It will therefore be appreciated that, where present, an anti-blocking layer would be applied to the second surface of the polyester film substrate before application of the barrier layer(s) and electronic component(s) described hereinabove. Coating of the anti-blocking coating may be effected using any suitable coating technique, including gravure roll coating, reverse roll coating, dip coating, bead coating, extrusion-coating, melt-coating or electrostatic spray coating. The coating step preferably avoids the use of organic solvent.

The adhesive coating used in the present invention is derived from an aqueous composition comprising an aliphatic polyurethane.

The adhesive composition is suitably thermally curable.

The term "aliphatic polyurethane" as used herein refers to a polyurethane derivable from one or more aliphatic diisocyanates and one or more polymeric polyols.

Examples of suitable aliphatic diisocyanates include those having the general formula O=C=N—$R^1$—N=C=O, wherein $R^1$ represents an aliphatic hydrocarbyl group comprising from 2 to 16 carbon atoms. Examples of suitable aliphatic diisocyanates include 1,6-diisocyanatohexane (HDI), 1,4-diisocyanatobutane, 1-isocyanato-5-isocyanatomethyl-3,3,5-trimethyl-cyclohexane or isophorone diisocyanate (PIDI), bis(4-isocyanatocyclohexyl)methane, cyclohexane diisocyanate (CNDI), 2,2,4-trimethylhexamethylene diisocyanate (TMDI), 1,3-bis(isocyanatomethyl cyclohexane ($H_6$XDI), 1,1' methylenebis(4-isocyanato)-cyclohexane ($H_{12}$MDI) and mixtures thereof.

Suitable polymeric polyols include those having from 2 to 8 reactive hydroxyl groups, for example from 2 to 4 reactive hydroxyl groups, for example 2 reactive hydroxyl groups.

Suitable polymeric polyols include those having a weight average molecular weight of from 200 to 8,000, for example from 500 to 5,000, for example from 1,000 to 3,000.

Suitable polymeric polyols include polyether polyols, polyester polyols, polyacrylate polyols and polycarbonate polyols. Preferably, the polymeric polyol is a polyester polyol.

The term polyether polyol as used herein refers to a hydroxyl-substituted polymer obtainable via the ring-opening polymerisation of one or more cyclic ethers. Examples of suitable cyclic ethers include ethylene oxide, propylene oxide and tetrahydrofuran. Preferably, the polyether polyol is polypropylene oxide, polyethylene oxide, or a random, block or capped copolymer of ethylene oxide and propylene oxide.

The preparation of polyether polyols via the ring-opening polymerisation of one or more cyclic ethers is usually initiated by one or more polyfunctional initiators. Suitable initiators include polyols and polyamines. The initiator may be selected so as to control the functionality (i.e. the number of reactive hydroxyl groups) of the polyether polyol that is produced. If the ring-opening polymerisation is initiated by a diol, the resulting polyether has a functionality of 2. Other initiators may be selected to provide polyether polyols having higher functionality, for example up to 8. Suitable diols include ethylene glycol, propylene glycol, 1,3-propanediol, 1,4-butane diol and 1,4-cyclohexanedimethanol. Initiators providing polyethers of higher functionality include glycerol, trimethylolpropane and triethanolamine (to provide a functionality of 3), pentaerythritol and ethylenediamine (to provide a functionality of 4), diethylenetriamine (to provide a functionality of 5), sorbitol (to provide a functionality of 6), and sucrose (to provide a functionality of 6).

Suitable polyether polyols have from to 2 to 8 reactive hydroxyl groups, for example from 2 to 4 reactive hydroxyl groups, for example 2 reactive hydroxyl groups, and/or a weight average molecular weight of from 200 to 8,000, for example from 500 to 5,000, for example from 1,000 to 3,000.

Preferred polyether polyols include polyethylene glycols and polypropylene glycols having a weight average molecular weight of from 500 to 5,000, or from 1,000 to 3,000 and containing from 2 to 4, preferably 2, reactive hydroxyl groups.

The term polyester polyol as used herein refers to a linear or branched polyester with terminal hydroxyl groups. Suitable polyesters may be obtained via the condensation of one or more dicarboxylic acids and one or more diols, or via the ring-opening polymerisation of a lactone. Examples of suitable dicarboxylic acids are $C_2$ to $C_8$ aliphatic or aromatic dicarboxylic acids, such as oxalic acid, malonic acid, succinic acid, maleic acid, fumaric acid, adipic acid, phthalic acid, isophthalic acid and terephthalic acid. Preferred dicarboxylic acids are aliphatic dicarboxylic acids, in particular adipic acid. Examples of suitable diols include ethylene glycol, diethylene glycol, propylene glycol, dipropylene glycol, 1,3-propanediol, 1,4-butane diol, 1,6-hexanediol and 1,4-cyclohexanedimethanol. The functionality of polyester polyols may optionally be increased by including one or more polyols having a functionality of 3 or above, such as glycerol, trimethylolpropane, triethanolamine, and pentaerythritol.

Suitable condensation polyester polyols include those having from 2 to 8 reactive hydroxyl groups, for example from 2 to 4 reactive hydroxyl groups, for example 2 reactive hydroxyl groups, and/or a weight average molecular weight of from 200 to 8,000, for example from 500 to 5,000, for example from 1,000 to 3,000.

Preferred condensation polyester polyols include ethylene glycol adipates and diethylene glycol adipates having a weight average molecular weight of from 500 to 5,000, or from 1,000 to 3,000 and containing on average from 2 to 4, preferably 2, reactive hydroxyl groups.

Examples of suitable lactones include β-propiolactone, γ-butyrolactone, δ-valerolactone, and ε-caprolactone. A preferred lactone is ε-caprolactone. As with polyether polyols, the ring opening polymerisation of lactones may suitably be initiated by one or more polyfunctional initiators, which are preferably polyol initiators. Suitable polyol initiators may be selected according to the functionality of the polyester polyol that is required, and suitable initiators include ethylene glycol, propylene glycol, 1,3-propanediol, 1,4-butane diol, 1,4-cyclohexanedimethanol, glycerol, trimethylolpropane, triethanolamine, and pentaerythritol.

Suitable ring-opening polyether polyols include those having from 2 to 4 reactive hydroxyl groups, for example 2 reactive hydroxyl groups, and/or a weight average molecular weight of from 200 to 8,000, for example from 500 to 5,000, for example from 1,000 to 3,000.

Preferred ring-opening polyester polyols include polycaprolactones having a weight average molecular weight of from 500 to 5,000, or from 1,000 to 3,000 and containing from 2 to 4, preferably 2, reactive hydroxyl groups.

The term polycarbonate polyol as used herein refers to a linear or branched polycarbonate with terminal hydroxyl groups. Suitable polycarbonates may be obtained via the reaction of a diol with phosgene or a phosgene synthetic equivalent. Examples of suitable diols include aliphatic diols, such as ethylene glycol, diethylene glycol, propylene glycol, dipropylene glycol, 1,3-propanediol, 1,4-butane diol, 1,6-hexanediol and 1,4-cyclohexanedimethanol. Suitable diols also include aromatic diols, such as benzene-1,4-diol and the members of the group of bisphenols [such as methylenediphenyl-4,4'-diol (also known as bisphenol-F), and 4,4'-(propane-2,2-diyl)diphenol (also known as bisphenol-A)]. The functionality of polycarbonate polyols may optionally be increased by including one or more polyols having a functionality of 3 or above, such as glycerol, trimethylolpropane, triethanolamine, and pentaerythritol.

Suitable polycarbonate polyols include those containing on average from 2 to 8 reactive hydroxyl groups, for example 2 to 4 reactive hydroxyl groups, for example 2 reactive hydroxyl groups, and/or having a weight average molecular weight of from 200 to 8,000, for example from 500 to 5,000, for example from 1,000 to 3,000.

Preferred polycarbonate polyols include aromatic polycarbonates, preferably derived from benzene-1,4-diol or bisphenol-A, and having a weight average molecular weight of from 500 to 5,000, or from 1,000 to 3,000 and containing on average from 2 to 4, preferably 2, reactive hydroxyl groups.

The term polyacrylate polyol as used herein refers to polymers obtainable by the addition polymerisation of a hydroxyl-substituted acrylate monomer with one or more, preferably two or more ethylenically unsaturated comonomers. Suitable hydroxyl-substituted acrylate monomers include 2-hydroxyethylacrylate and 2-hydroxyethyl methacrylate. Suitable ethylenically unsaturated comonomers include methylacrylate, ethylacrylate, butylacrylate, methylmethacrylate, ethylmethacrylate, butylmethacrylate and styrene.

Suitable polyacrylate polyols include those containing on average from 2 to 8 reactive hydroxyl groups, for example 2 to 4 reactive hydroxyl groups, for example 2 reactive hydroxyl groups, and/or having a weight average molecular weight of from 200 to 8,000, for example from 500 to 5,000, for example from 1,000 to 3,000.

Preferred polyacrylate polyols include those derived from 2-hydroxyethylacrylate or 2-hydroxyethylmethacrylate and at least one of methylacrylate, ethylacrylate, methylmethacrylate and ethylmethacrylate, having a weight average molecular weight of from 500 to 5,000, or from 1,000 to 3,000, and containing on average from 2 to 4, preferably 2, reactive hydroxyl groups.

Preferably, the polyurethane component further comprises residues derived from one or more low molecular weight diols, referred to in the art as "chain extenders". The chain extenders react with the diisocyanate to form a rigid or 'hard' sequence known as a 'hard block'. Isocyanate-capped hard block precursors can be reacted with the polymeric polyols (known as 'soft blocks') described above to form a segmented block copolymer having alternating rigid and flexible segments. Polyurethanes of this type are known in the art as "polyurethane elastomers".

Suitable diols for use as chain extenders include $C_1$ to $C_6$ diols and dimers thereof, such as ethylene glycol, diethylene glycol, propylene glycol, dipropylene glycol, 1,3-propanediol, 1,4-butane diol and 1,4-cyclohexanedimethanol. Preferred chain extenders are ethylene glycol and butane-1,4-diol. Chain extenders may suitably be present in the polyurethane in an amount of from 1 to 40 wt % for example from 2 to 20 wt %, for example 3 to 15 wt %, based on the weight of the chain extender diol.

Preferably, the polyurethane is derivable from an aliphatic diisocyanate and one or more polyester or polycarbonate polyols. In a particularly preferred embodiment, the polyurethane is derivable from an aliphatic diisocyanate and a polymeric polyol selected from the group consisting of polycaprolactone diols, polycarbonate diols and mixtures thereof.

The adhesive composition used in the present invention preferably further comprises acrylic monomers.

Examples of suitable acrylic monomers include acrylic acid, methacrylic acid or a derivative of acrylic acid or methacrylic acid, preferably an ester of acrylic acid or methacrylic acid, in particular an alkyl ester where the alkyl group contains up to ten carbon atoms such as methyl, ethyl, n-propyl, isopropyl, n-butyl, isobutyl, terbutyl, hexyl, heptyl and n-octyl, acrylonitrile, methacrylonitrile, halo-substituted acrylonitrile, halo-substituted methacrylonitrile, hydroxyethyl methacrylate (HEMA), glycidyl acrylate, glycidyl methacrylate, itaconic acid, itaconic anhydride and half esters of itaconic acid. Preferred acrylic monomers include methyl methacrylate, ethyl acrylate, isopropyl acrylate, butyl acrylate, butyl methacrylate, pentaerythritol acrylate type materials and HEMA.

Where acrylic monomers are present, the adhesive composition may be a urethane-acrylic hybrid polymer dispersion (HPD). Such dispersions are known and described in, for example, Galgoci et al., JCT CoatingsTech, 2(13), 28 to 36 (February 2005). In these dispersions, the urethane and acrylic polymers are incorporated into the same dispersion. There are generally two methods for preparing HPDs which result in "Type 1" and "Type 2" dispersions, respectively. A "Type 1" HPD is prepared by preparing a dispersion of the aliphatic polyurethane described above and then adding acrylic monomers to the aliphatic polyurethane dispersion. The result is a hybrid dispersion which shows two glass transition temperature (Tg) peaks when assessed by dynamic mechanical analysis (DMA). According to DMA, tan δ is plotted against temperature and a peak in the tan δ plot is indicative of a Tg peak. The peaks for a "Type 1" HPD are broader than would be obtained for a simple blend of the two components and this is attributed to a limited degree of molecular mixing.

Alternatively, a "Type 2" HPD may be prepared by preparing an aliphatic polyurethane prepolymer, adding the acrylic monomers to the prepolymer and then dispersing the mixture in water such that the urethane and acrylic polymerizations are completed concurrently. A "Type 2" HPD shows only a single, very broad tan δ peak which spans the Tgs for the individual components when analysed by DMA. This single peak is strong evidence of polymer-polymer mixing and the formation of an interpenetrating network.

The adhesive composition used in the present invention may be a "Type 1" or "Type 2" HPD.

Where present, the acrylic monomer(s) may comprise at least about 40 mole %, alternatively at least about 50 mole %, alternatively at least about 60 mole %, alternatively at least about 70 mole % of the adhesive composition which is used in the present invention.

Preferably, the adhesive compositions used in the present invention have a low total content of nitrogen. The skilled person will be familiar with techniques which may be used to determine the nitrogen content of the adhesive composition. Examples include Inorganic Elemental Analysis, XPS and NMR. In one embodiment, the total nitrogen content of the adhesive compositions used in the present invention is in the range from about 1 to about 6 mole %, preferably in the range from about 2 to about 4 mole %. The ratio of nitrogen to carbon present in the adhesive composition may be in the range from about 0.01 to about 0.06, in one embodiment, in the range from about 0.02 to about 0.05.

The adhesive compositions used in the present invention may further comprise a diluent. Where present, the diluent may be selected from the group consisting of N-ethyl pyrrolidone, butyl diglycol and N-methyl pyrrolidone.

The adhesive compositions used in the present invention preferably have a solids content of at least 2% by weight, in one embodiment at least 5% by weight, in one embodiment at least 10% by weight, in one embodiment at least 15% by weight, in one embodiment, at least 20% by weight, in one embodiment, at least 30% by weight, in one embodiment at least 40% by weight.

Preferably, the adhesive composition from which the adhesive coating of the present invention is derived comprises an aliphatic polyurethane, poly(butylmethacrylate), polycaprolactone and poly(hexamethylene carbonate). Where this is the case, the aliphatic polyurethane may be present in an amount in the range from 5 to 15 mole %, preferably 7 to 12 mole %; the poly(butylmethacrylate) may be present in an amount in the range from about 40 to about 80 mole %, preferably in the range from about 55 to about 75 mole %; the polycaprolactone may be present in an amount in the range from about 7 to about 19 mole %, preferably in the range from about 9 to about 15 mole %; and the poly(hexamethylene carbonate) present in an amount in the range from about 5 to about 15 mole %, preferably in the range from about 7 to about 12 mole %, based on the total content of carbonyl group-containing species present in the composition. The composition of the adhesive composition may be determined by NMR analysis.

Preferably the adhesive composition used in the present invention is a polyurethane/acrylic dispersion, such as Incorez® W2205 (Incorez Custom Chemistry; UK).

As described herein, in order to be useful in the manufacture of electronic devices, in particular displays, an essential feature of the adhesive coatings used in the present invention is that they are switchable. This means that, initially (i.e. prior to elevated-temperature processing during the fabrication of an electronic device), the adhesion between the adhesive coating and the polyester film substrate is greater than the adhesion between the adhesive coating and the glass or silicon wafer substrate. However, after exposure to high processing temperatures, this changes, or switches, such that the adhesion between the adhesive coating and the glass or silicon wafer substrate is greater than that between the adhesive coating and the polyester film substrate. The result is that, after exposure to high processing temperatures, the polyester film substrate can be peeled away from the glass or silicon wafer substrate, which is used purely to provide stability during processing steps, and the adhesive coating will remain on the glass or silicon wafer substrate and they can thus be disposed of together. The adhesive coatings used in the present invention show excellent switchability such that the peeling of the polyester film substrate from the glass or silicon wafer substrate is clean without any adhesive residue remaining on the surface of the polyester film substrate. This is particularly important in an industry where the presence of even only a minor amount of an unwanted contaminant can have adverse effects. The term "clean without any adhesive residue" means that the presence of adhesive is not detectable by attenuated total reflectance (ATR) as described herein.

In the method of manufacturing an electronic device according to the present invention, the laminate is heated to a temperature of at least 150° C., preferably at least about 160° C., preferably at least about 170° C., preferably at least about 180° C., and preferably no more than 250° C., preferably no more than about 230° C., preferably less than 220° C., preferably no more than about 210° C., preferably no more than about 200° C. It is this heating which causes the adhesive composition to switch.

In addition to showing this switchability, the adhesive compositions of the present invention are also advantageous because they show little and preferably no bubbling when subjected to processing temperatures of 150° C. or greater (typically at least 180° C., and preferably less than 220° C., preferably no more than about 210° C., preferably no more than about 200° C.), and preferably little or no bubbling over the temperature range of 150° C. to 200° C. This is a significant step forward in the industry as it broadens the conditions under which the manufacturing techniques described herein may be applied.

The inventors have surprisingly found that the adhesive compositions used in the present invention which provide the combination of properties described hereinabove are those wherein the change in the glass transition temperature (at onset) of the adhesive coating derived from the adhesive composition, after heating to at least 150° C. (or at least 180° C., and preferably no more than 250° C., preferably no more than about 230° C., preferably less than 220° C., preferably no more than about 210° C., preferably no more than about 200° C.) for at least two minutes, is no more than about 15° C., preferably no more than about 12° C., preferably no more than about 10° C., preferably no more than about 5° C., as measured by modulated differential scanning calorimetry (DSC). This change in the glass transition temperature (at onset) of the adhesive coating is referred to herein as $\Delta Tg$ (onset), preferably wherein $\Delta Tg$ (onset)=[Tg (at onset) prior to heating to 150° C. for two minutes]-[Tg (at onset) after heating to 150° C. for two minutes], preferably as measured in air.

Where the adhesive compositions satisfy this requirement, they show excellent switchability. Modulated DSC is a conventional technique described for example in Thermal Analysis of Polymer, Joseph D Menczel, R Bruce Prime (Eds), Wiley, ISBN 978-0-471-76917-0, Chapter 2, pages 168 to 207. The technique of modulated DSC is preferred because it is possible to separate thermal processes from kinetic processes and hence it is possible to investigate the Tg without interference from other processes such as crystallisation.

Thus, in a second aspect, the present invention provides a polyester film comprising a polyester film substrate and an adhesive coating, wherein the adhesive coating is derived from an aqueous composition comprising an aliphatic polyurethane, and wherein the adhesive coating exhibits a $\Delta Tg$ (onset) as defined hereinabove of no more than about 15° C., preferably no more than about 12° C., preferably no more than about 10° C., preferably no more than about 5° C., as measured by modulated differential scanning calorimetry (DSC). Such polyester films are particularly useful in the manufacture of electronic devices, in particular electronic displays.

The polyester films of the second aspect may be prepared by a method comprising the steps of (a) providing a polyester film substrate, (b) coating an aqueous composition comprising an aliphatic polyurethane onto a first surface of the polyester film substrate, and (c) drying the aqueous composition to form an adhesive coating.

As noted hereinabove, the adhesive compositions of the present invention advantageously withstand higher processing temperatures without exhibiting the problematic degradation and bubbling which is seen with conventionally used adhesive coatings. Without wishing to be bound by theory, the inventors believe that the degree to which the composition degrades and bubbles at elevated temperatures is related to the amount of carbon dioxide evolved during heating. The inventors have assessed the amount of carbon dioxide evolution in the following ways.

A first method to assess the amount of carbon dioxide evolution relies on FTIR-TGA analysis of the asymmetric stretching absorption of CO2 in the region of 2200 to 2400cm$^{-1}$ of the infrared spectrum. In the work reported herein, the asymmetric stretch was observed as a multiplet with a relatively more intense absorption at 2364cm$^{-1}$ and a relatively less intense absorption at 2330cm$^{-1}$. The FTIR-TGA analysis is conducted while heating the sample at a defined rate (10° C./min) from 40° C. followed by an isothermal hold at a final temperature for a defined time (preferably 5 minutes), and then compared with same $CO_2$ IR absorption in atmospheric air under the same temperature cycle. The FTIR-TGA analysis utilises a Thermo Scientific iS50 FTIR spectrometer and the associated software (OMNIC™ Mercury TGA), which converts the absorption spectrum over the range of 2200 to 2400 cm$^{-1}$ into a graphical representation using a mathematical function called a Gram-Schmidt output, which is then converted into a "chemigram" of the $CO_2$ response against time, relative to the background $CO_2$ absorption spectrum in atmospheric air (see "*TGA-IR Analysis using the OMNIC Mercury TGA Software*", White Paper 52352, 2012 (WP52352_E 07/12M), Michael S. Bradley, Thermo Fisher Scientific, Wis., USA). The intensity of the asymmetric stretching absorption of $CO_2$ is measured periodically at defined time or temperature intervals during the experiment (normally at defined time intervals, and preferably intervals of every 20 seconds). In the work reported herein, the collection time for each scan was about 20 seconds, and thus the scan is repeated every 20 seconds. The analysis therefore allows an assessment of the amount of $CO_2$ evolved during the course of the experiment. In the present invention, the adhesive coating preferably exhibits a $CO_2$ peak relative intensity of less than 0.2, and preferably no more than 0.1, and preferably substantially zero, wherein $CO_2$ peak relative intensity is defined as the intensity of the $CO_2$ asymmetric stretching absorption in the region of 2200 to 2400 $cm^{-1}$ of the infrared spectrum as measured by FTIR-TGA analysis at 18 minutes during a temperature cycle which consists of heating the adhesive coating at 10° C./min from 40° C. to an isothermal hold at 200° C. for 5 minutes, relative to the intensity of the same $CO_2$ asymmetric stretching absorption of atmospheric air in the same temperature cycle.

The second method to assess the amount of carbon dioxide evolution also relies on FTIR-TGA analysis of the asymmetric stretching absorption of $CO_2$ in the region of 2200 to 2400 $cm^{-1}$ of the infrared spectrum. The FTIR-TGA analysis is conducted as described above, i.e. by heating the sample at a defined rate (10° C./min) from 40° C. followed by an isothermal hold at a final temperature for 5 minutes. In the second method, however, the intensity of the $CO_2$ asymmetric stretching absorption at 18 minutes during this temperature cycle is used to assess the amount of $CO_2$ evolved. Preferably, the relatively more intense, higher wavenumber absorption peak (observed at 2364 $cm^{-1}$ in the work described herein) of the multiplet is used for this analysis. The absorption peak intensities are calibrated by the procedure described herein which measures the same $CO_2$ asymmetric stretching absorption of a known volume of atmospheric air containing a known amount of $CO_2$. The amount of $CO_2$ in atmospheric air can be measured by procedures known and conventional in the art. Using simple gas laws, it is straightforward to correlate the $CO_2$ absorbance of atmospheric air and the mass of $CO_2$ in the FTIR-TGA cell. In the present invention, the adhesive coating preferably evolves no more than 31, preferably no more than 30, preferably no more than 29, and preferably no more than 28 μg of $CO_2$ per 25 mg of the adhesive coating as measured by FTIR-TGA analysis of the $CO_2$ asymmetric stretching absorption in the infrared spectrum at 18 minutes during a temperature cycle which consists of heating the adhesive coating at 10° C./min from 40° C. to an isothermal hold at 180° C. for 5 minutes.

Thus, in a third aspect, the present invention provides a polyester film comprising a polyester film substrate and an adhesive coating, wherein the adhesive coating is derived from an aqueous composition comprising an aliphatic polyurethane, and wherein the adhesive coating exhibits a $CO_2$ peak relative intensity of less than 0.2, and preferably no more than 0.1, and preferably substantially zero, wherein $CO_2$ peak relative intensity is defined as the intensity of the $CO_2$ asymmetric stretching absorption in the region of 2200 to 2400 $cm^{-1}$ of the infrared spectrum as measured by FTIR-TGA analysis at 18 minutes during a temperature cycle which consists of heating the adhesive coating at 10° C./min from 40° C. to an isothermal hold at 200° C. for 5 minutes, relative to the intensity of the same $CO_2$ asymmetric stretching absorption of atmospheric air in the same temperature cycle, and/or wherein the adhesive coating evolves no more than 31, preferably no more than 30, preferably no more than 29, and preferably no more than 28 μg of $CO_2$ per 25 mg of the adhesive coating as measured by FTIR-TGA analysis of the $CO_2$ asymmetric stretching absorption in the infrared spectrum at 18 minutes during a temperature cycle which consists of heating the adhesive coating at 10° C./min from 40° C. to an isothermal hold at 180° C. for 5 minutes. Such polyester films are particularly useful in the manufacture of electronic devices, in particular electronic displays.

The polyester films of the third aspect may be prepared by a method comprising the steps of (a) providing a polyester film substrate, (b) coating an aqueous composition comprising an aliphatic polyurethane onto a first surface of the polyester film substrate, and (c) drying the aqueous composition to form an adhesive coating.

The adhesive coating preferably has a dry thickness (i.e. the thickness of the coating in the finished film) of at least about 5.0 μm, preferably at least about 7.0 μm and more preferably at least about 8.0 μm. The dry thickness of the adhesive coating is preferably less than about 15 μm, preferably less than about 12 μm, preferably less than about 10 μm.

The adhesive coating of the present invention may be a hard coating. In this regard, the adhesive coating preferably has a Persoz hardness of greater than about 150 seconds.

According to a fourth aspect of the present invention, there is provided a laminate comprising (i) a polyester film substrate having a first surface and a second surface, (ii) an adhesive coating derived from an aqueous composition comprising an aliphatic polyurethane, and (iii) a glass or silicon wafer substrate, wherein the adhesive coating is disposed between the polyester film substrate and the glass or silicon wafer substrate.

With regard to the glass or silicon wafer substrate, any suitable grade or type of these materials may be used in the present invention, as conventional in the art. In particular, for small scale laminates, standard laboratory glass sheets or microscope slides can be used, whereas on the commercial scale, substrates of the sort supplied by Corning Inc. or Schott AG may be employed successfully. Suitable such substrates include crown glass, borosilicate and fused silica, glass sheets of thickness approx. 0.5 mm to 1.7 mm and with in-plane dimensions up to about 3000 mm×3000 mm. Silicon wafers, either of research grade or commercial grade are produced by global suppliers such as SVM Inc., Siltronic AG or JEL Corporation. The wafer diameter and thickness will typically range from 25 mm to 300 mm and from about 250 microns to greater than 700 microns respectively.

The laminates of the fourth aspect of the present invention may be produced by a method comprising:
  a. providing a polyester film substrate having a first surface and a second surface;
  b. coating an aqueous composition comprising an aliphatic polyurethane onto a first surface of the polyester film substrate;
  c. drying the aqueous composition to form an adhesive coating; and
  d. laminating a glass or silicon wafer substrate to the first surface of the polyester film substrate such that the adhesive coating is disposed between the polyester film substrate and the glass or silicon wafer substrate.

Step (d) in the method to prepare the laminates of the fourth aspect may be performed at a temperature in the range from about 60 to about 100° C., preferably in the range from about 70 to about 90° C., in one embodiment, at about 80° C. and at a pressure in the range from about 65 to about 350 kPa, preferably in the range from about 125 to 225 kPa, and in one embodiment, at a pressure of about 172 kPa.

In a fifth aspect, the present invention further provides the use of an aqueous composition comprising an aliphatic polyurethane as defined herein as a temperature-switchable adhesive coating in a polyester film which comprises a polyester substrate and the adhesive coating.

Property Measurement

The following analyses were used to characterize the films and laminates described herein:

(i) Clarity is evaluated by measuring total luminance transmission (TLT) and haze (% of scattered transmitted visible light) through the total thickness of the film using an M57D spherical hazemeter (Diffusion Systems) according to the standard test method ASTM D1003.
(ii) Transmission Optical Density (TOD) is measured using a Macbeth Densitometer TR 927 (obtained from Dent and Woods Ltd, Basingstoke, UK) in transmission mode.
(iii) Whiteness index is measured using a Colorgard System 2000, Model/45 (manufactured by Pacific Scientific) and the principles of ASTM D 313.
(iv) Intrinsic viscosity (in units of dL/g) of the polyester and polyester film is measured by solution viscometry in accordance with ASTM D5225-98(2003) on a Viscotek™ Y-501C Relative Viscometer (see, for instance, Hitchcock, Hammons & Yau in *American Laboratory* (August 1994) "The dual-capillary method for modern-day viscometry") by using a 0.5% by weight solution of polyester in o-chlorophenol at 25° C. and using the Billmeyer single-point method to calculate intrinsic viscosity:

$$\eta = 0.25\eta_{red} + 0.75(\ln\eta_{rel})/c$$

wherein:
$\eta$=the intrinsic viscosity (in dL/g),
$\eta_{rel}$=the relative viscosity,
c=the concentration (in g/dL), &
$\eta_{red}$=reduced viscosity (in dL/g), which is equivalent to $(\eta_{rel}-1)/c$ (also expressed as $\eta_{sp}/c$ where $\eta_{sp}$ is the specific viscosity).

(v) Thermal shrinkage is assessed for film samples of dimensions 200 mm×10 mm which were cut in specific directions relative to the machine and transverse directions of the film and marked for visual measurement. The longer dimension of the sample (i.e. the 200 mm dimension) corresponds to the film direction for which shrinkage is being tested, i.e. for the assessment of shrinkage in the machine direction, the 200 mm dimension of the test sample is oriented along the machine direction of the film. After heating the specimen to the predetermined temperature of 150° C. (by placing in a heated oven at that temperature) and holding for an interval of 30 minutes, it was cooled to room temperature and its dimensions re-measured manually. The thermal shrinkage was calculated and expressed as a percentage of the original length.
(vi) X-ray Photoelectron Spectroscopy (XPS) analysis using a Kratos "Axis Ultra" instrument may be performed on a drop of the aqueous composition from which the adhesive coating is derived on a PET substrate left to dry overnight in an oven at a temperature of approximately 40° C. The data was recorded from an approximately 300 μm×700 μm elliptical area using monochromated Al kα X-rays. XPS has a sampling depth of approximately 10 nm.
(vii) Elemental analysis was performed using a Thermo Flash 2000 elemental analyser. The sample was then heated at 150° C. for 18 hours to remove solvents and then reanalysed using the Thermo Flash 2000. The drying step was repeated at a temperature of 200° C. and for a time of 3 hours after which the sample was then re-analysed.
(viii) NMR analysis was performed on samples dissolved in deuterated pyridine. A Jeol Instrument, model JNM-ECS400 was used for the analysis.
(ix) Modulated differential scanning calorimetry (DSC) experiments were run on a TA Instruments Q100 DSC and the conditions were as follows: a sample of the adhesive composition was cast from an aqueous solution and left to dry to completeness overnight in a fume cupboard. A sample (5 mg) was loaded into the DSC instrument and cooled to −90° C., left for 5 minutes to equilibrate, and then a modulation of +/−1° C./60 seconds was applied at the same time as a heating rate of 3° C./min up to an upper temperature of 180° C.
(x) Dynamic mechanical analysis (DMA) was performed by heating the sample between −125° C. and 220° C. at a rate of 4° C./minute on a TA Q800 DMA using tensile clamps. A frequency of 10 Hz and a strain of 0.1% were used. The sample sizes tested were all approximately 14.5 mm×5.1 mm×1.2 mm.
(xi) FTIR-TGA was performed using a Thermo Scientific Nicolet iS50 FTIR spectrometer and Mettler Toledo Thermal Gravimetric Analyser, coupled with a Thermo Scientific FTIR/TGA interface. The FTIR-TGA conditions used in all experiments were a heating rate of 10° C./min from 40° C. followed by a 5 minute isothermal hold at the final temperature. The samples were analysed at final temperatures of 180° C., 200° C. and 220° C.

Samples of the adhesive coating were prepared by pipetting 10 mL of the aqueous composition into an aluminium dish and allowing it to dry overnight in a fume cupboard. 25 mg specimens of the dried sample were added to 150 μL aluminium oxide crucibles (annealed at 1100° C.) and placed in the TGA carousel. An empty reference crucible was also included for the background measurement.

For collection of the data, the TGA/FTIR interface was positioned into the FTIR spectrometer and the transfer line was connected to the TGA equipment. The interface cell and transfer line were gradually heated to 220° C. over a period of two hours. Under standard test procedures, background FTIR spectra were taken before the TGA and FTIR data collection was started. The experiment was allowed to run for the allocated time (which varied depending on the final temperature) before FTIR collection was ended. Between each sample, the TGA was cooled to the starting temperature before starting the FTIR and TGA data collection. Three data sets were generated: (1) Gram-Schmidt graph (obtained using the FTIR); (2) IR spectra; (3) TGA graph. The Gram-Schmidt graph was used to generate a chemigram by setting the profile of the graph to the $CO_2$ region (2200-2400 $cm^{-1}$) and setting a baseline region (2200-2500 $cm^{-1}$). The chemigrams obtained allowed comparisons of $CO_2$ evolution between samples. The chemigrams of each sample were plotted on one graph, allowing the evolution of $CO_2$ to be studied for each sample over the duration of the experiment. The intensity of $CO_2$ after 18 minutes was recorded.

For the measurement of the amount of $CO_2$ evolved from the adhesive coating, the amount of $CO_2$ in atmospheric air was measured as 395 ppm $CO_2$. Conventional methods known in the art can be used to measure the amount of $CO_2$ in atmospheric air on the day of the experiment, for instance as used and disclosed by the Mauna Loa Observatory, Hawaii (http://www.esrl.noaa.gov/gmd/ccgg/about/co2 measurements.html), which also publishes its own data for the amounts of $CO_2$ in atmospheric air, and in one embodiment of the present invention, the amount of $CO_2$ in atmospheric air on the day of the experiment published by the Mauna Loa Observatory is taken as the amount of $CO_2$ in atmospheric air. The intensity of the $CO_2$ asymmetric stretching absorption was calibrated by the following method: a cell of volume 157 $cm^3$ was purged for at least 15 minutes with atmospheric air and then attached to the calibration line (shown in FIG. 11) with an internal volume of 100 cm$^3$; and wherein the remaining internal volume of the apparatus (i.e. the two flasks shown in FIG. 11) had a total volume of up to 7 litres. The line was evacuated to a pressure of 2 mbar before being isolated from the vacuum pump, the cell was then opened so that the air inside expanded into the calibration line. The cell was then removed and a sample was taken in the FTIR spectrometer after a 30 minute purge with an evacuated cell as a background scan. FIG. 12 shows the calibration plot used for the analysis (the error bars represent the error due to the 100 ml volume of the calibration line), wherein a line of best-fit was fitted to the data through the origin, yielding an equation of y=0.00066x where x is the mass of $CO_2$ evolved for the measured absorbance y. To ensure the calibration was correct and constant, repeats were carried out yielding a line of best fit of the same gradient. (xii) ATR analysis was performed using a Thermo Fisher iS50 with an in-built diamond ATR facility at an angle of 45°.

(xiii) Oxygen transmission rate is measured using ASTM D3985.
(xiv) Water vapour transmission rate is measured using ASTM F1249.

The invention is further illustrated by reference to the following figures and examples. The examples are not intended to limit the scope of the invention as described above.

BRIEF DESCRIPTION OF THE DRAWINGS

FIG. 5 shows TGA curves for NeoRad® R440, Alberdingk® Lux 399, Alberdingk® U8001 and Incorez® W2205 at a temperature of 180° C.

Figure 1A:
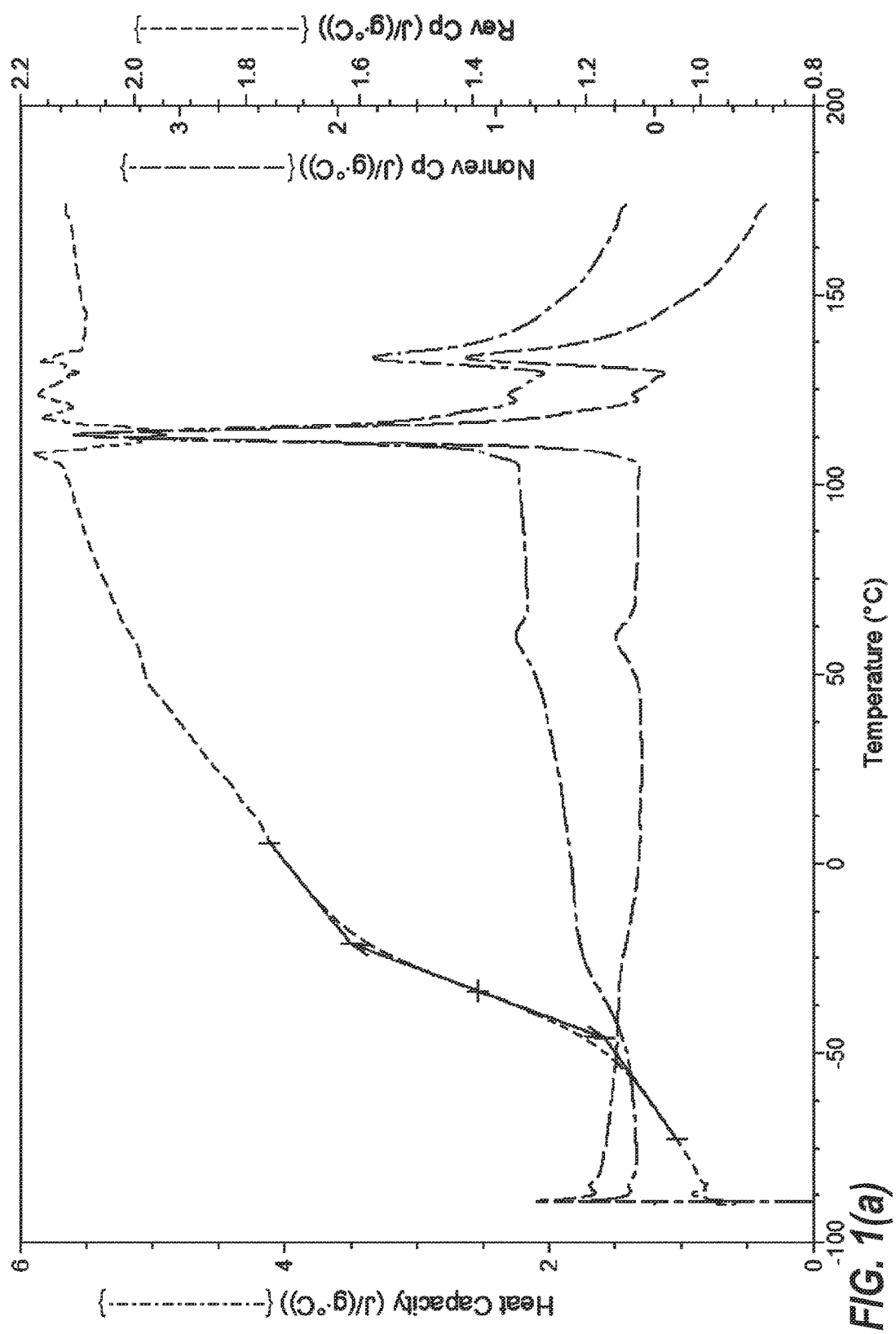
FIGS. 1(a) and (b) are modulated DSC traces for NeoRad® R440.
Figure 1B:
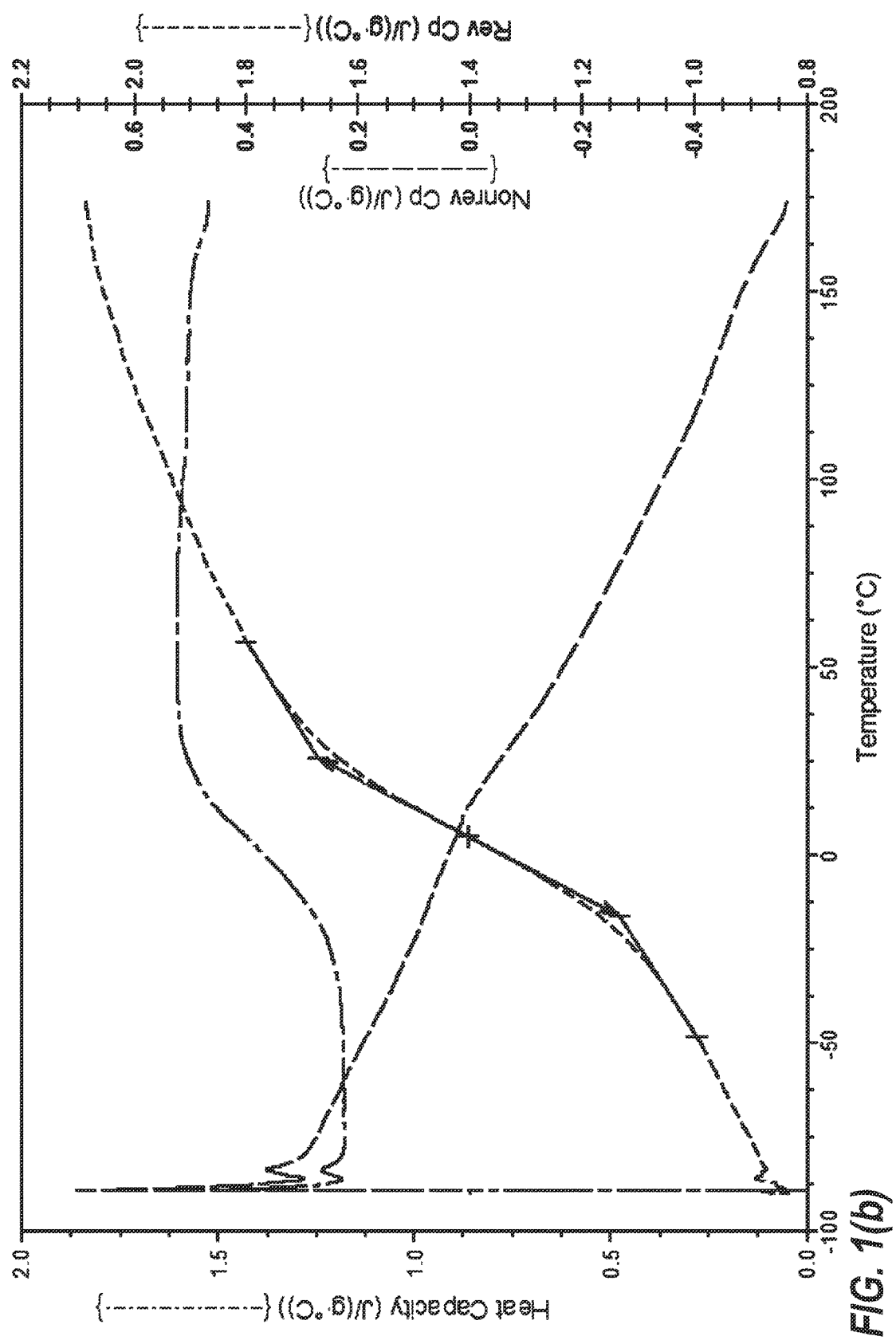
FIG. 1(c) is a plot of Heat Capacity vs temperature for NeoRad® 440 as determined by modulated DSC.
Figure 1C:
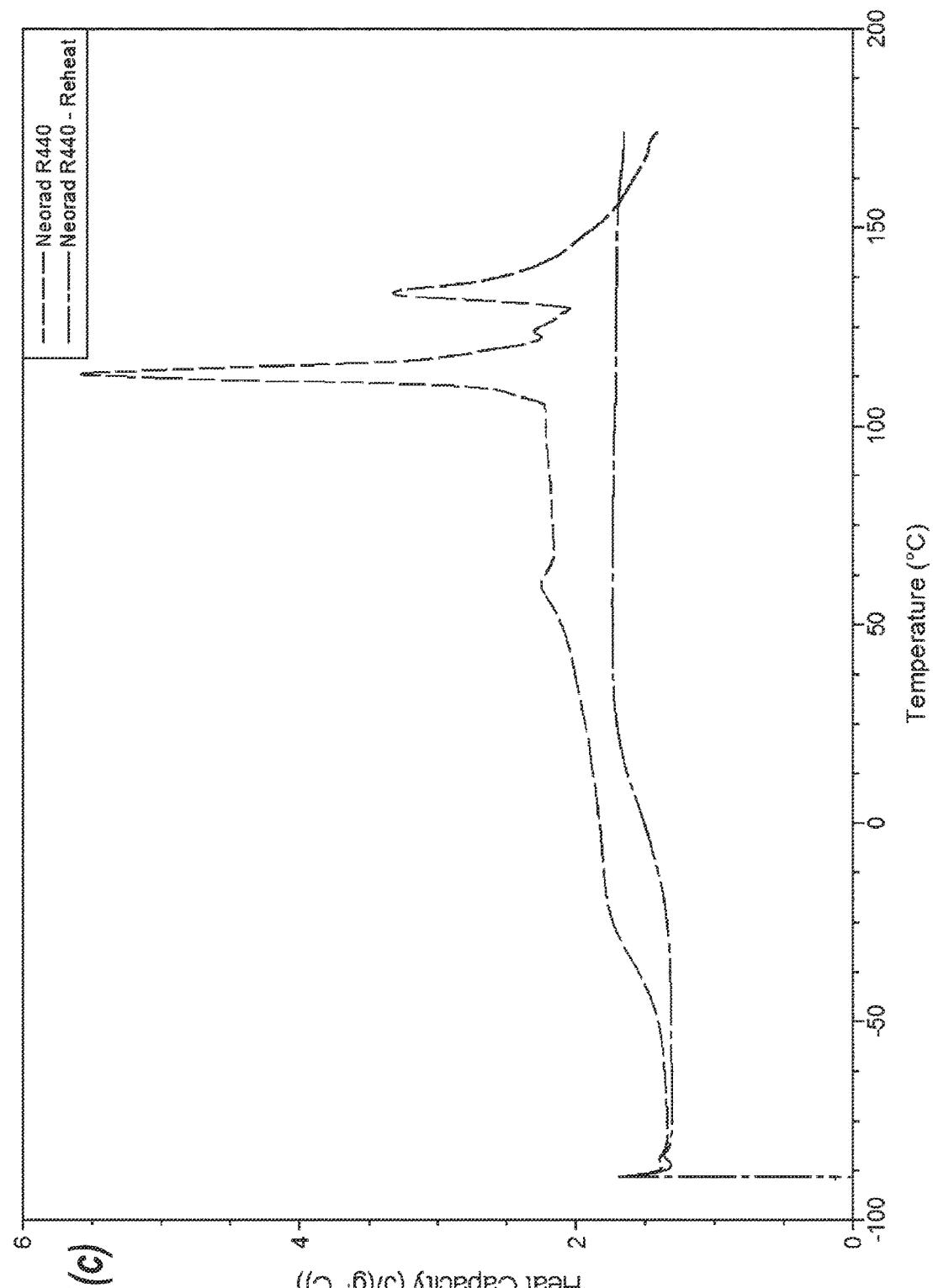
Figure 2A:
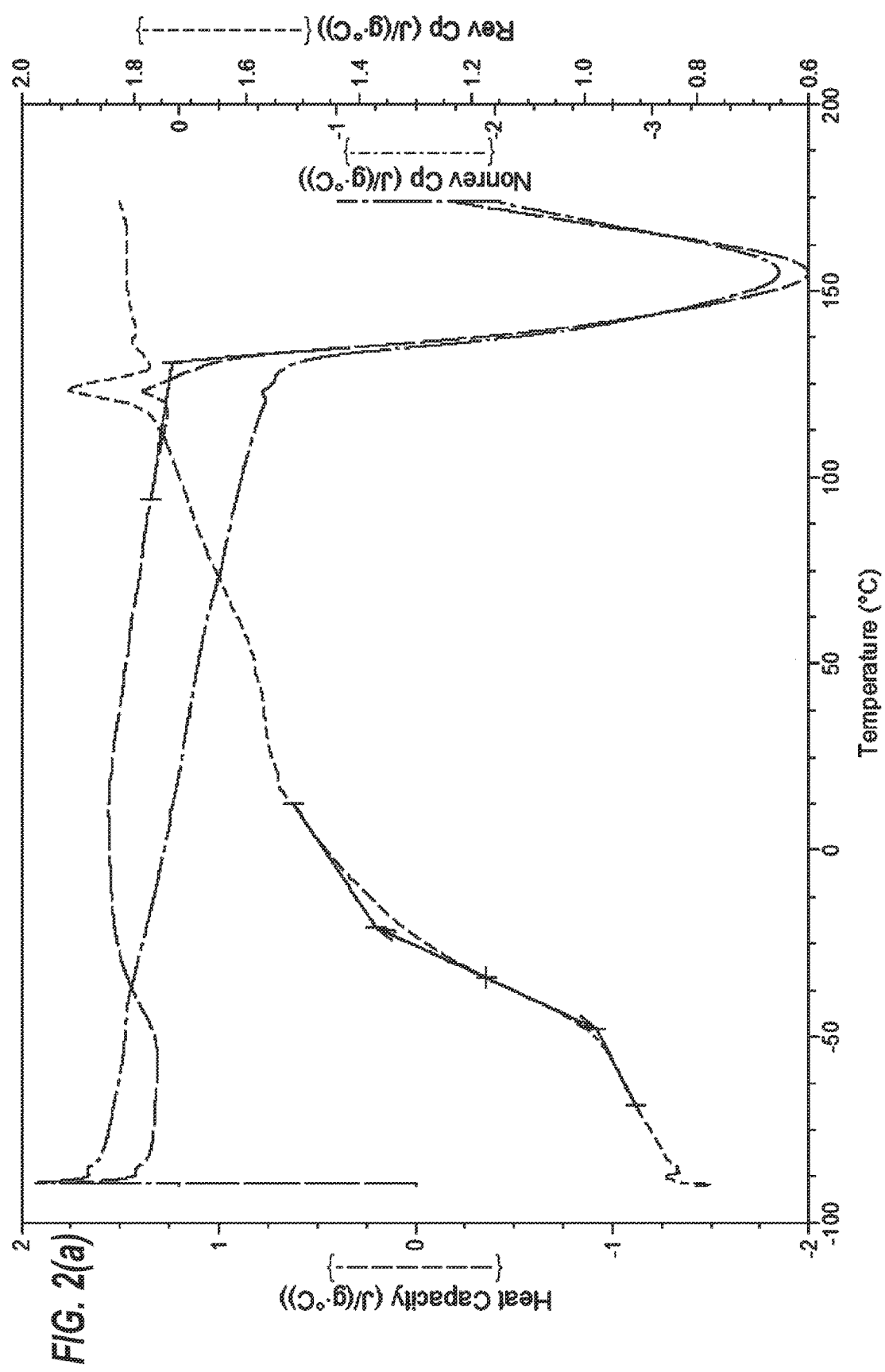
FIGS. 2(a) and (b) are modulated DSC traces for Alberdingk® Lux 399.
Figure 2B:
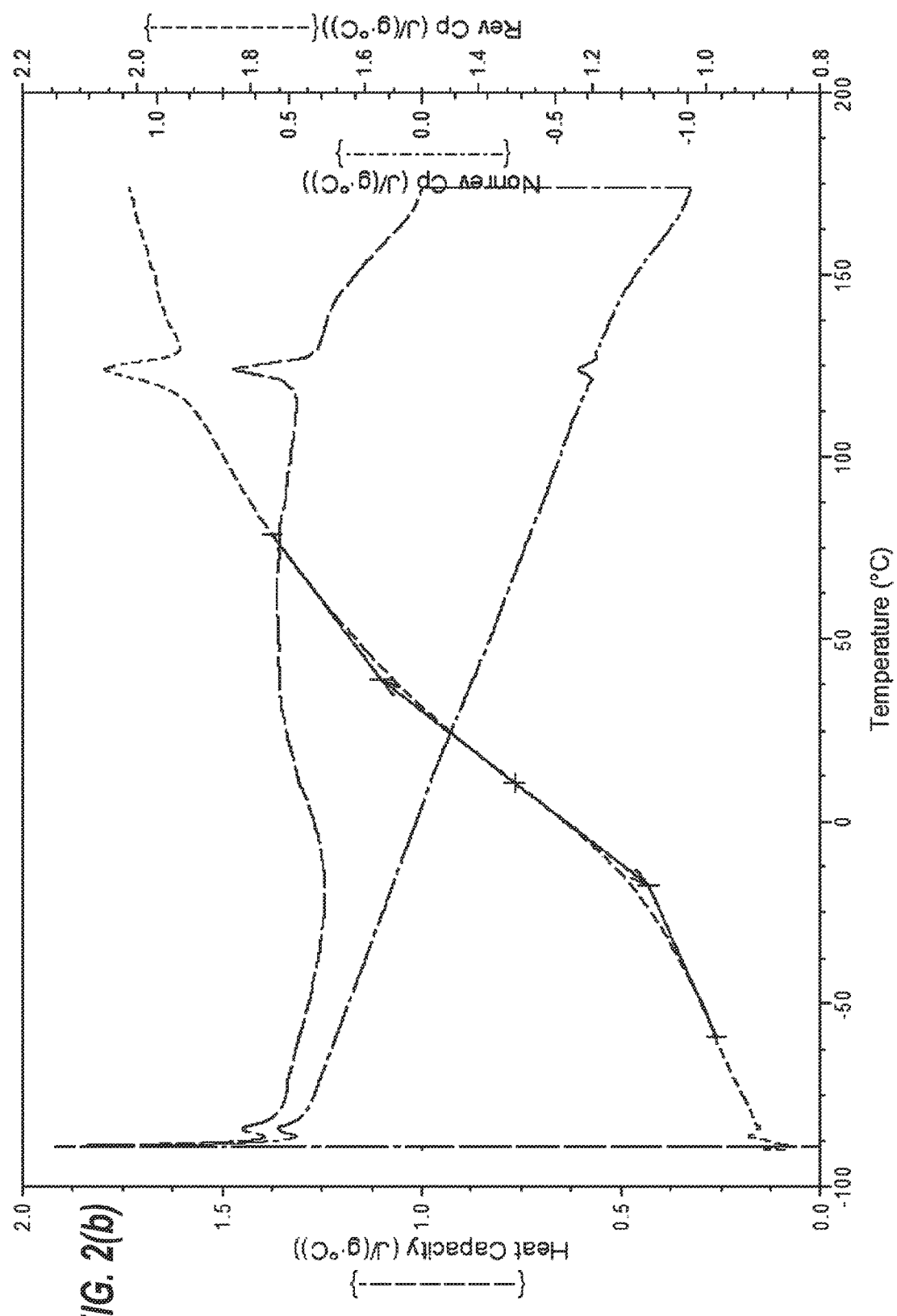
FIG. 2(c) is a plot of heat capacity vs temperature for Alberdingk® Lux 399 as determined by modulated DSC.
Figure 2C:
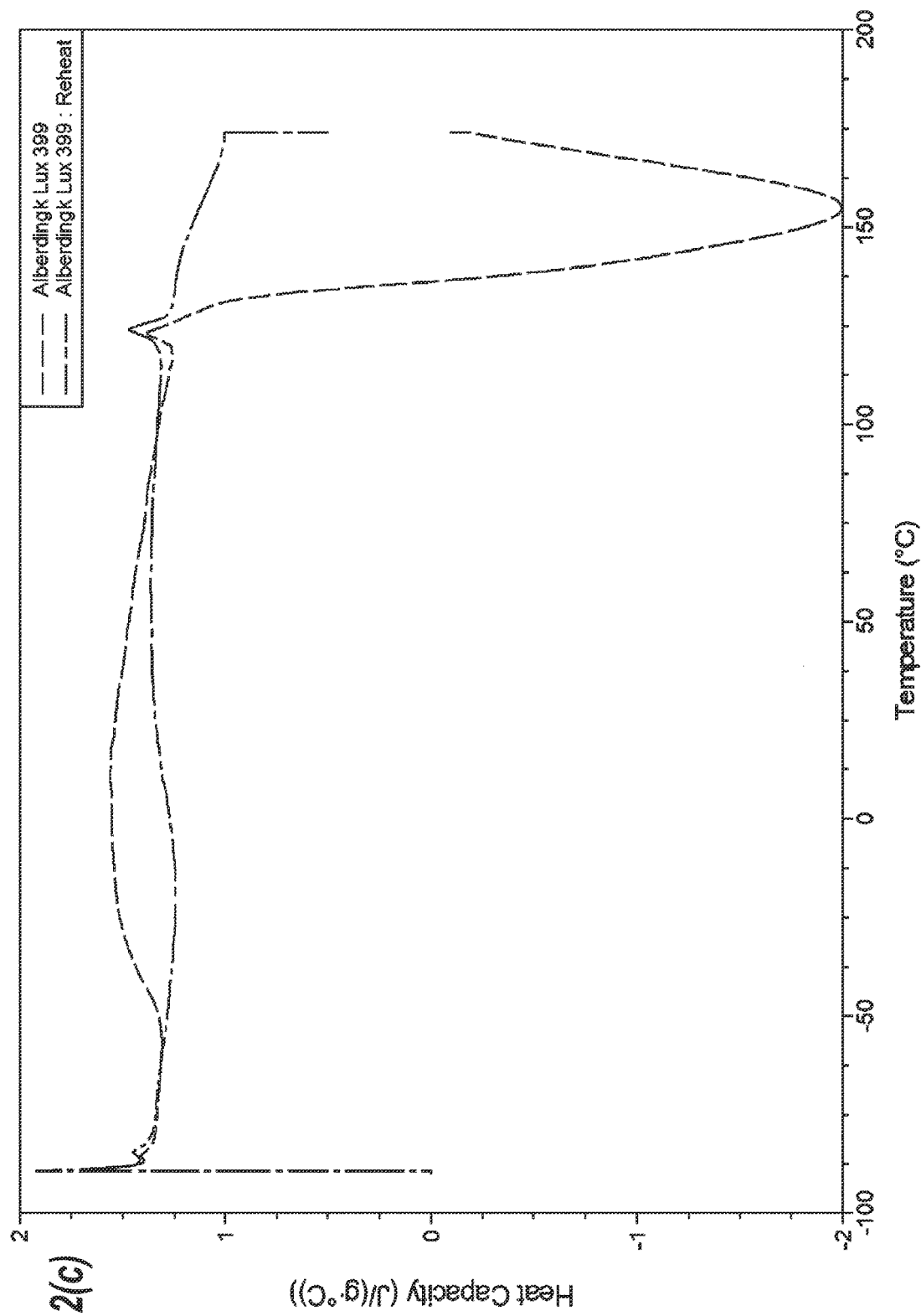
Figure 3A:
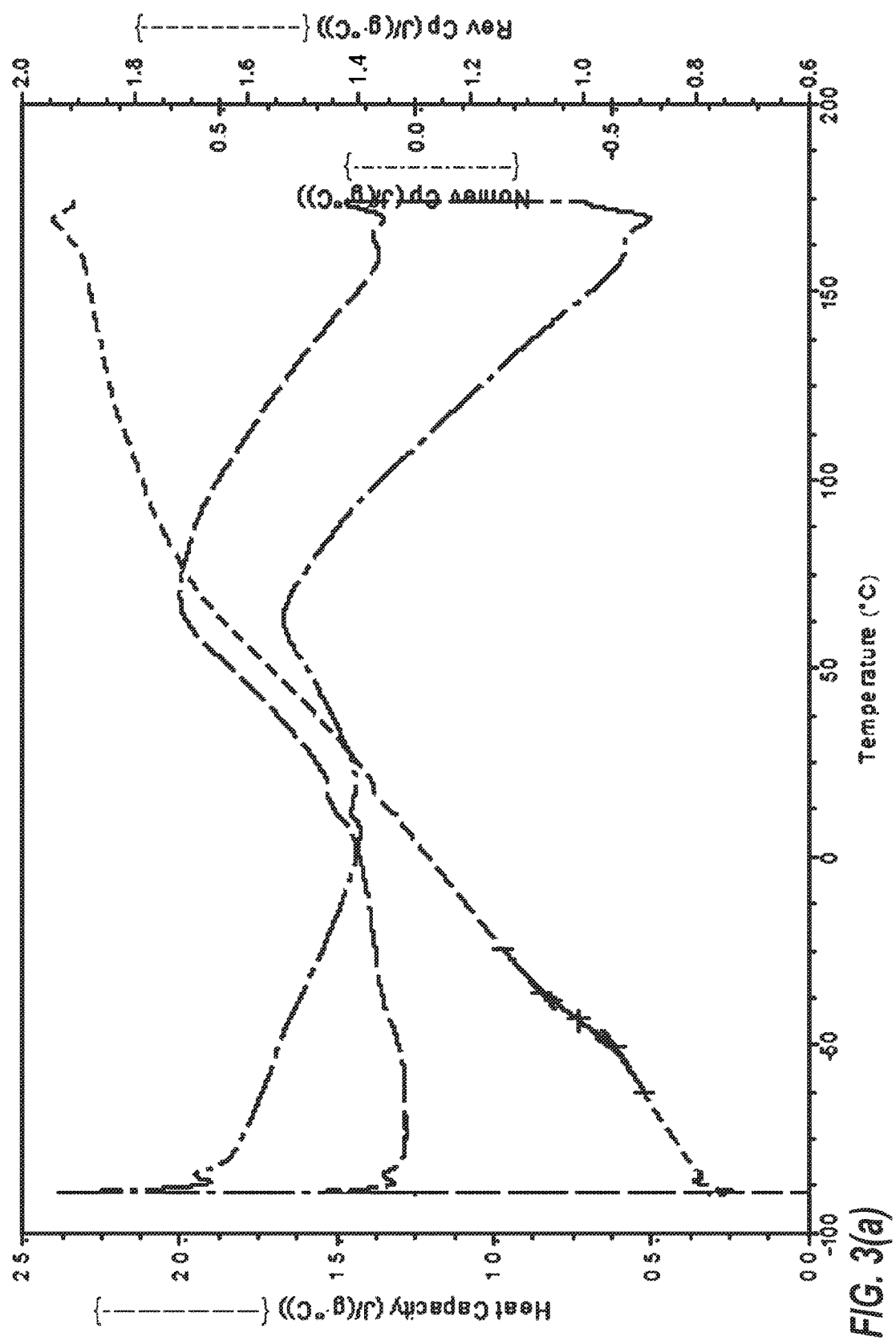
FIGS. 3(a) and (b) are modulated DSC traces for Alberdingk® U8001.
Figure 3B:
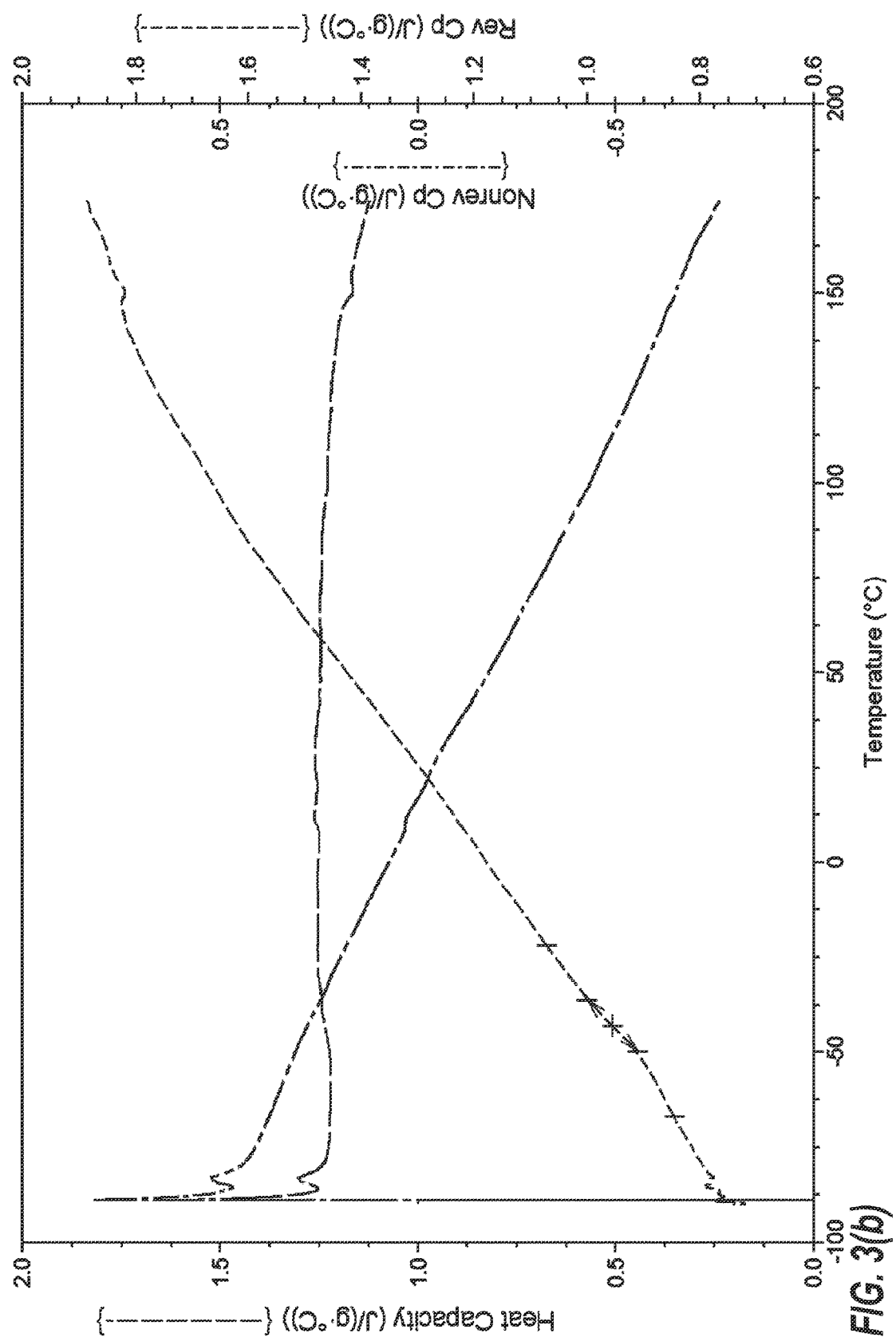
FIG. 3(c) is a plot of heat capacity vs temperature for Alberdingk® U8001 as determined by modulated DSC.
FIGS. 3(d) and 3(e) are DMA traces for Alberdingk® U8001.
Figure 3C:
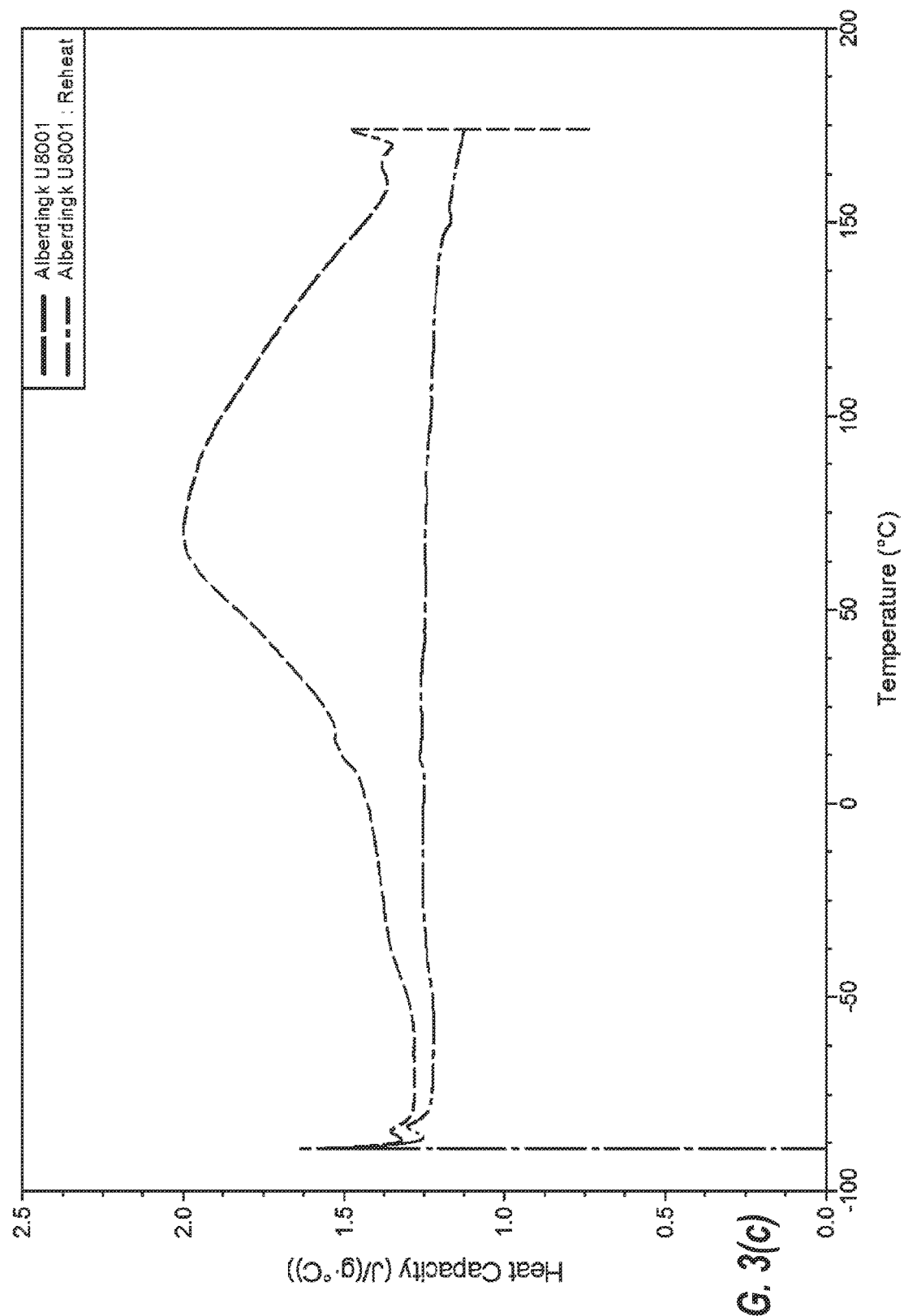
Figure 3D:
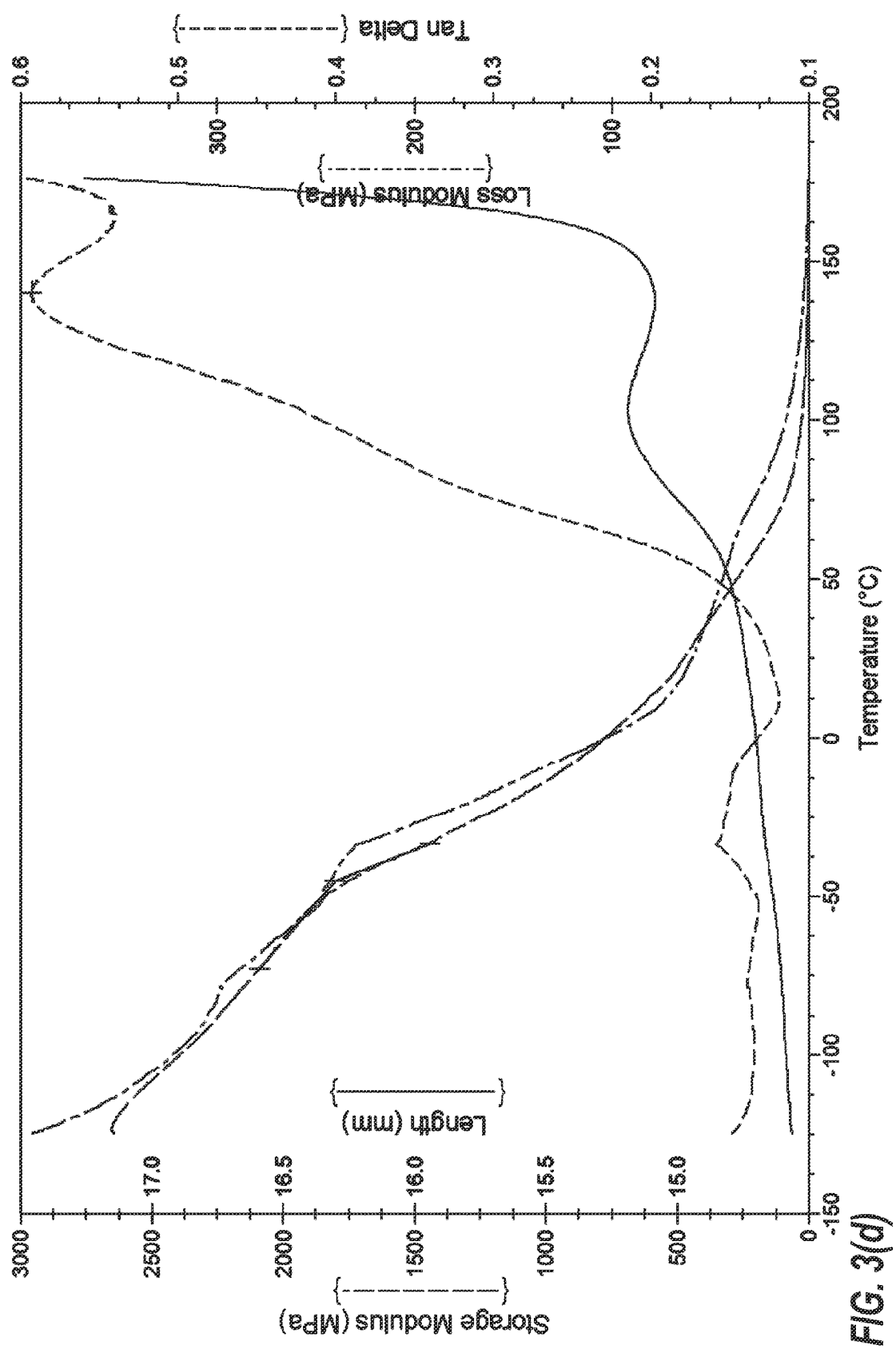
Figure 3E:
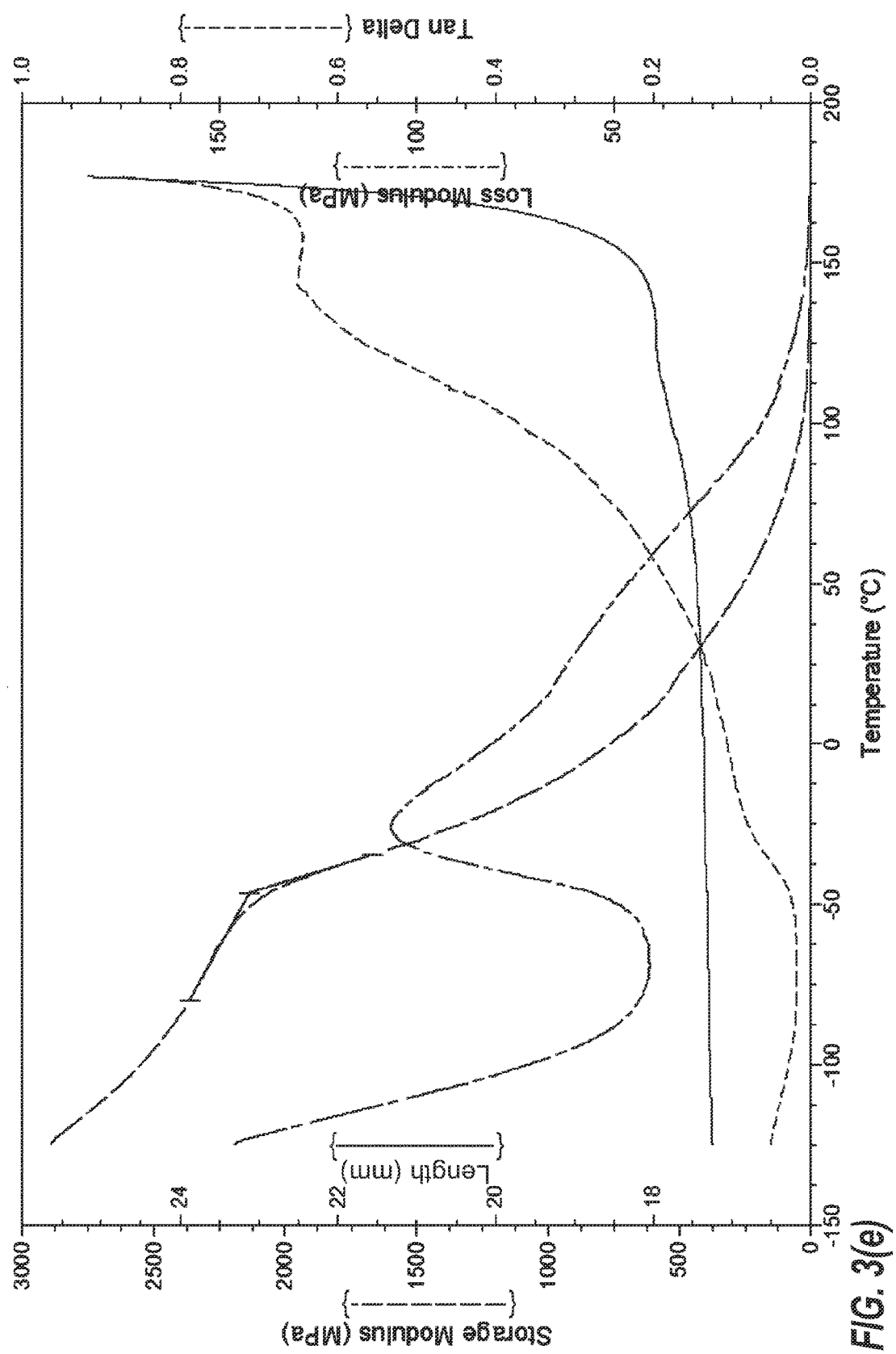
Figure 4A:
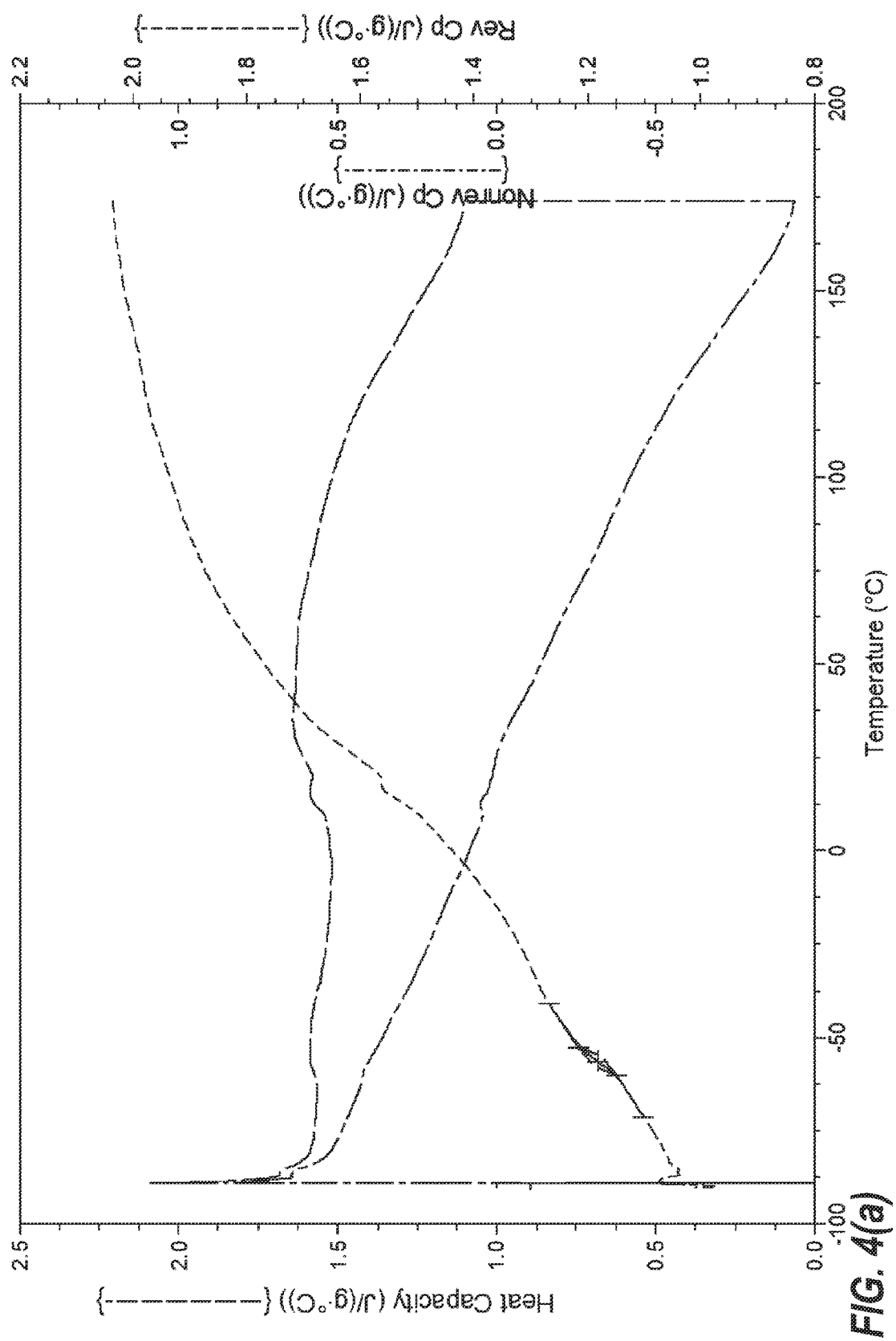
FIGS. 4(a) and (b) are modulated DSC traces for Incorex® W2205.
Figure 4B:
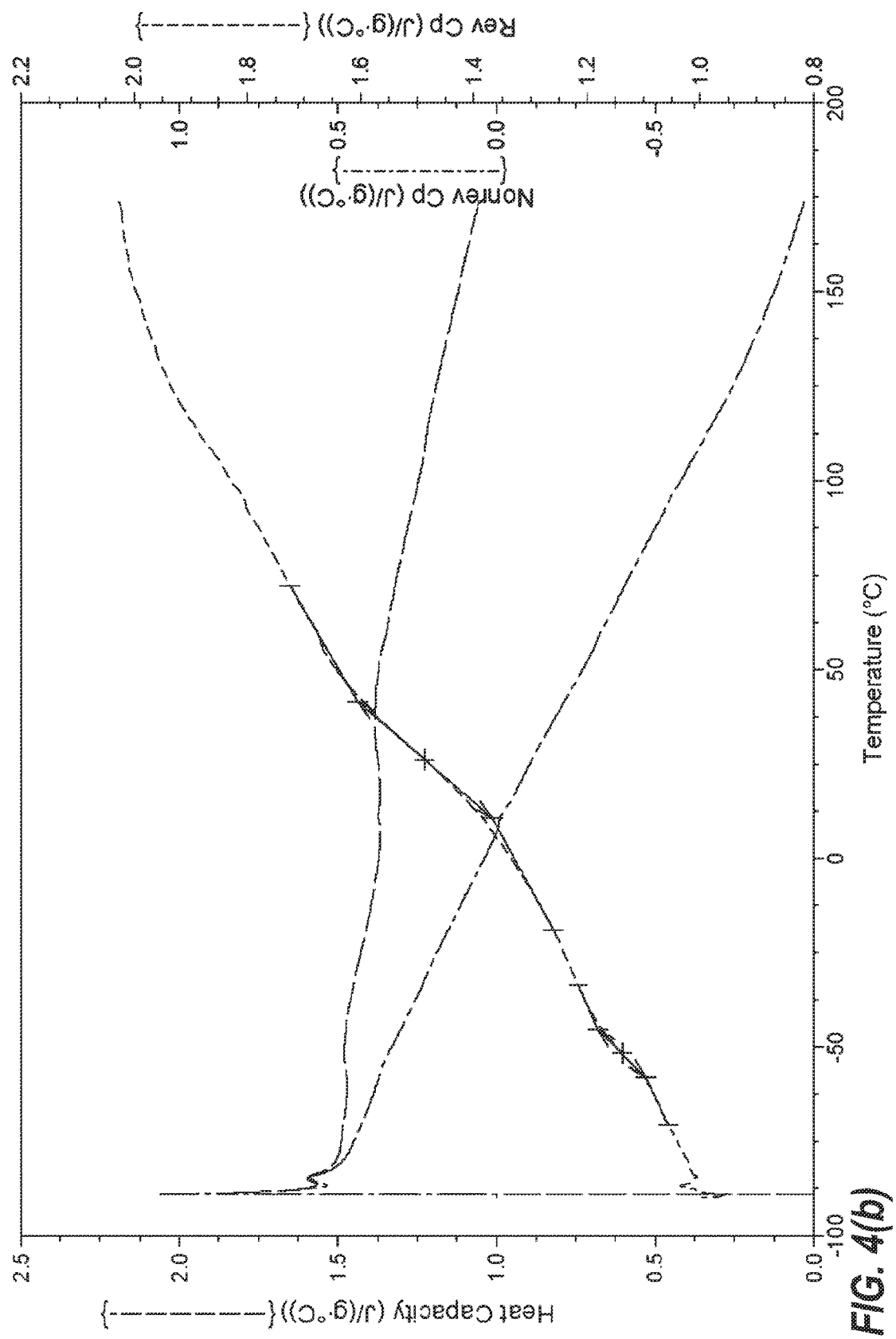
FIG. 4(c) is a plot of heat capacity vs temperature for Incorez® W2205 as determined by modulated DSC.
FIGS. 4(d) and (e) are DMA traces for Incorez® W2205.
Figure 4C:
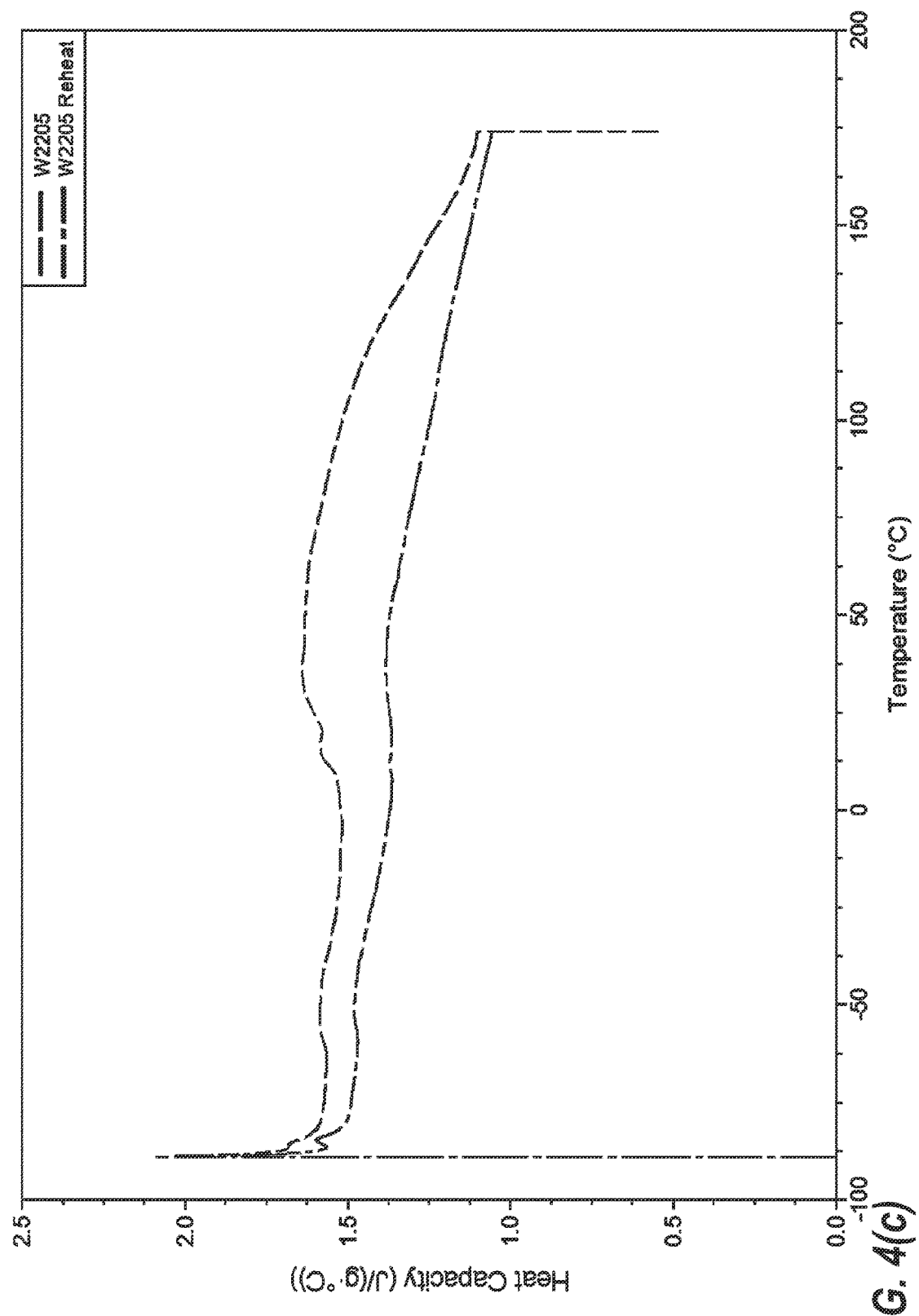
Figure 4D:
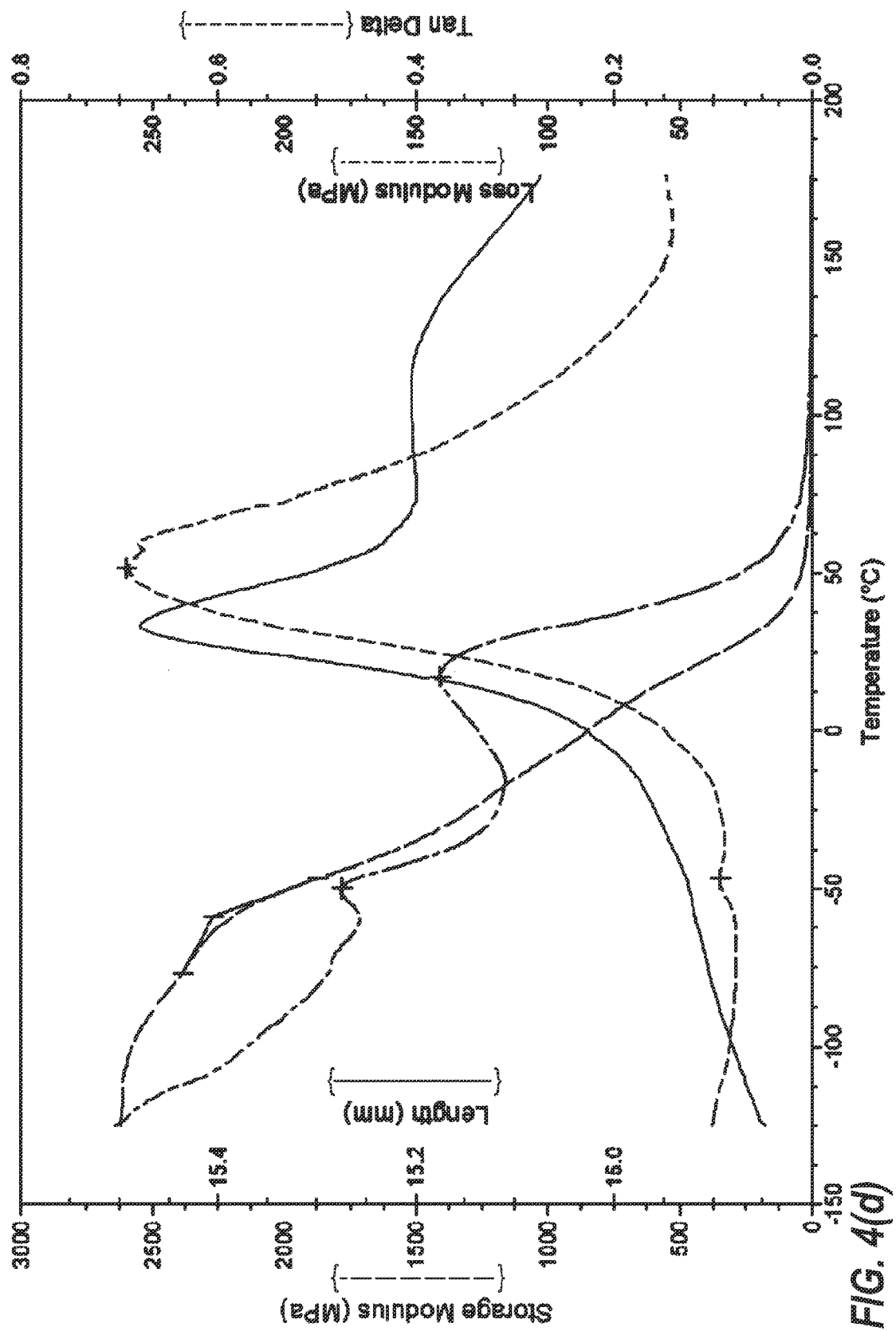
Figure 4E:
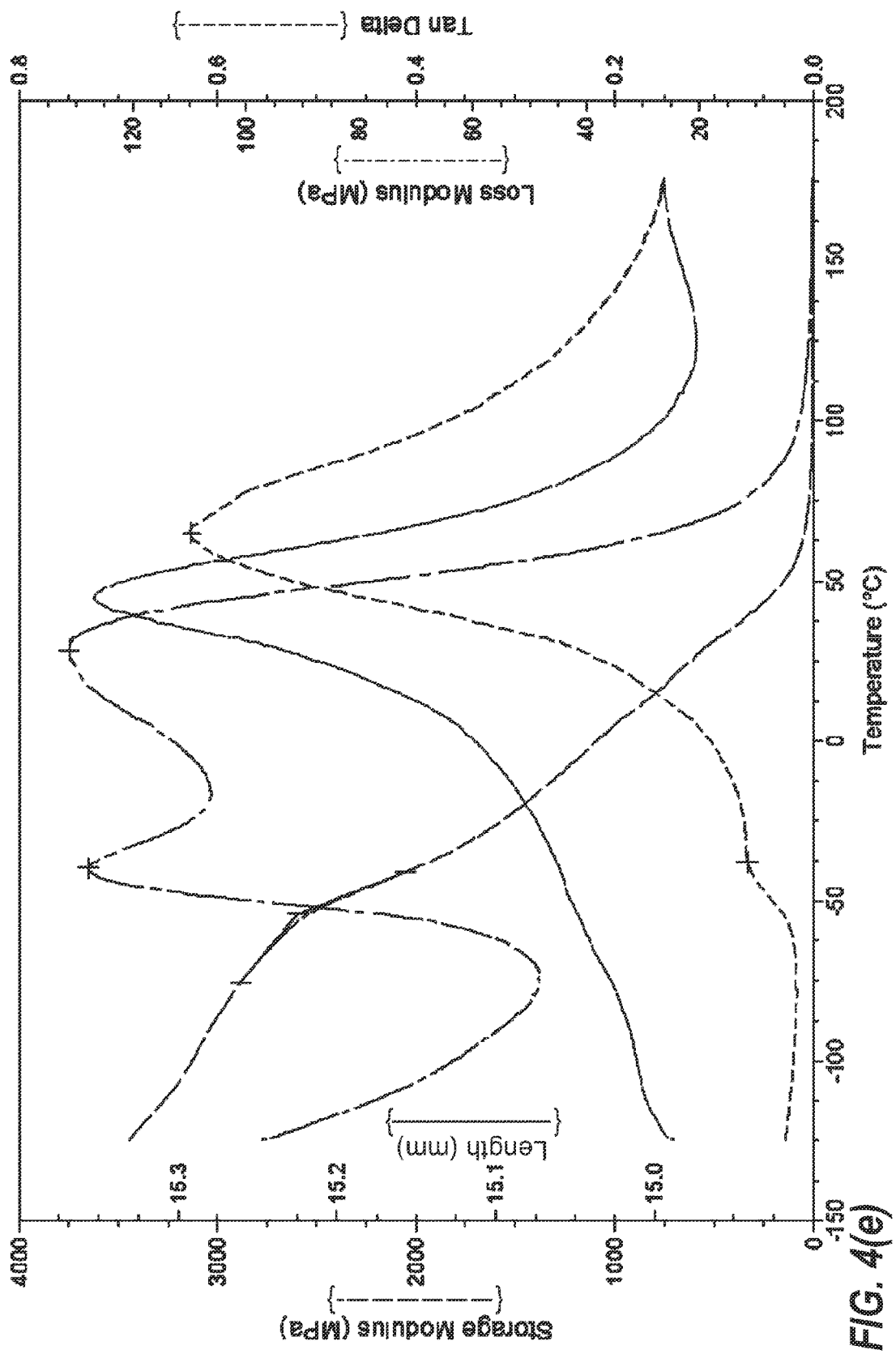
Figure 6:
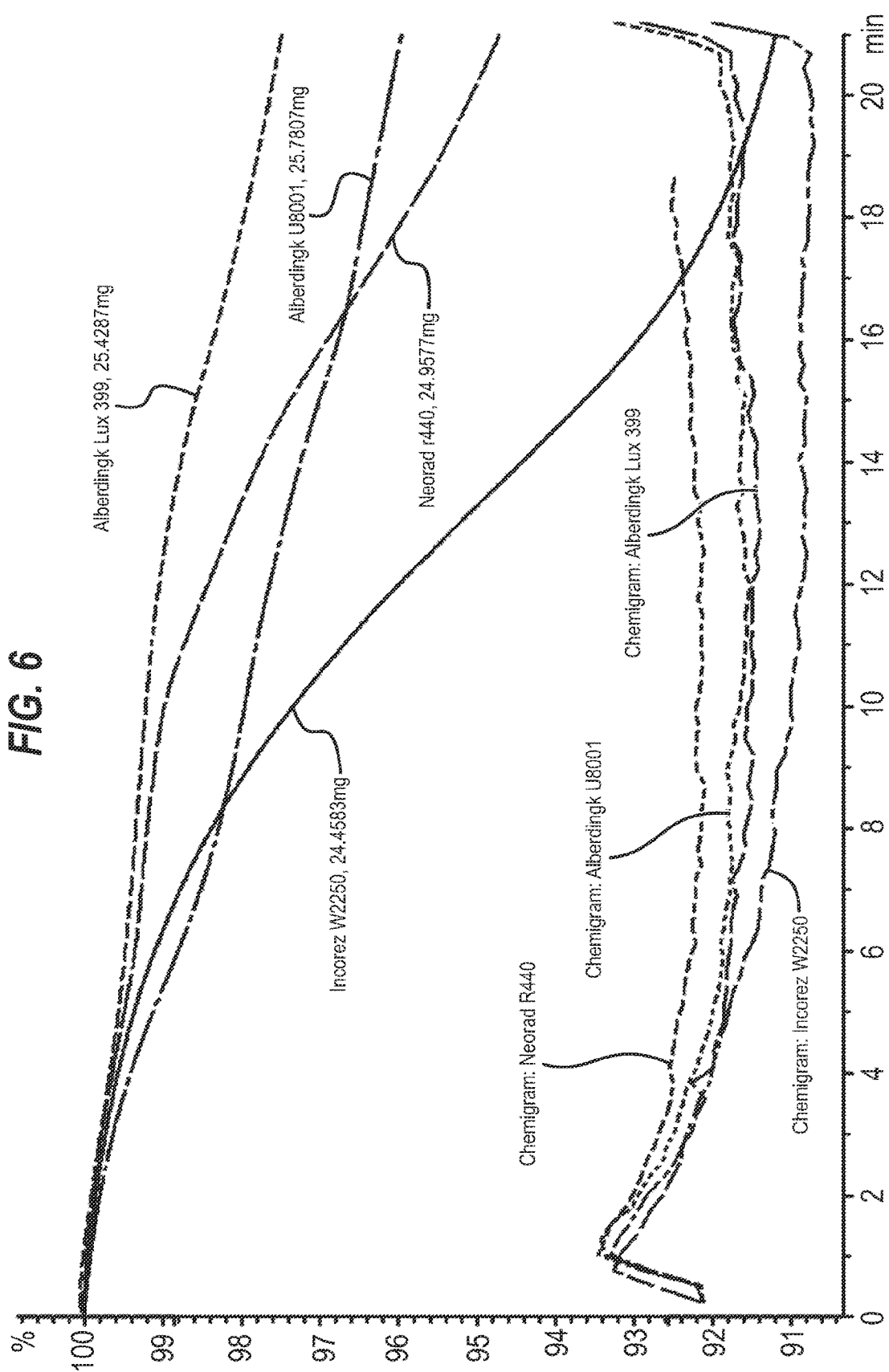
FIG. 6 shows TGA curves for NeoRad® R440, Alberdingk® Lux 399, Alberdingk® U8001 and Incorez® W2205 at a temperature of 200° C.
Figure 7:
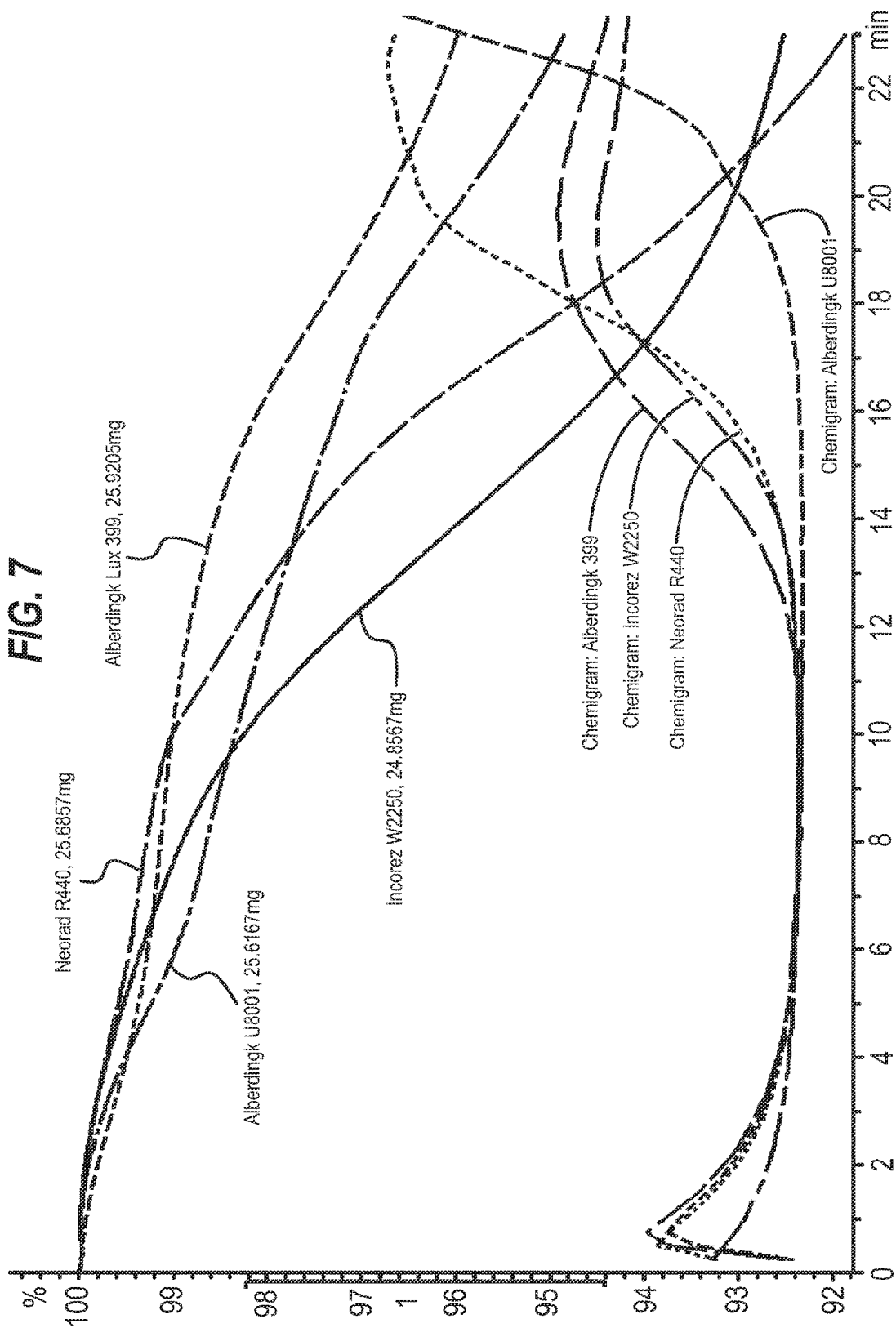
FIG. 7 shows TGA curves for NeoRad® R440, Alberdingk® Lux 399, Alberdingk® U8001 and Incorez® W2205 at a temperature of 220° C.

In the Figures, the terms "Rev Cp" and "Nonrev Cp" refer to reversing heat flow and non-reversing heat flow, respectively; the former thermal effects relate to the measurement of Tg and Tm, and the latter kinetic effects to crystallisation, as will be appreciated by the skilled person.

EXAMPLES

In the examples, adhesive coated polyester films were prepared, laminated to a glass slide and heated to a temperature of 150° C. for 2 minutes. The peel strength of the polyester film substrate from the glass or silicon wafer substrate was assessed. The laminates were also analysed for any sign of bubbling of the adhesive coating. The adhesive coatings used in each case are detailed in the specific examples.

Example 1

Coated films were prepared as follows. Polyethylene terephthalate was melt extruded, cast onto a cooled rotating drum and stretched in the direction of extrusion to approximately 3 times its original dimensions at a temperature of 150° C. The film was passed into a stenter oven at a temperature of 120° C. where the film was dried and stretched in the transverse direction to approximately 3 times its original dimensions and heat-set at a temperature of about 200° C. The heat-set biaxially stretched film was then unwound and then further heat-stabilised in a roll-to-roll process by passing the film through an additional set of ovens, of which the maximum temperature was above 150° C., for a duration of no more than 2 seconds. The film was transported through the ovens under a low line tension, allowing it to relax and stabilize further. The heat-stabilised film was coated on its upper surface with an adhesive coating composition as described in Table 1 below in an amount sufficient (about 50 μm wet-coat thickness) to provide the desired final dry thickness (which is from 7-15 μm). The polyester film substrate had a thickness of 125 μm in the final film.

The coated film was then laminated to a glass slide substrate (7.5 cm in length) by passing through a laminator nip roller at a speed of 25.4 cm/minute at a temperature of 80° C. and a pressure of 172 kPa. The laminates obtained were then heated to a temperature of 150° C. for 2 minutes and assessed for peel strength and bubbling.

TABLE 1

| Adhesive | Observations | Supplier | Description |
| --- | --- | --- | --- |
| Alberdingk AC2523 | Bubbling during thermal cure. | Alberdingk Boley GmbH | Self-crosslinking acrylic copolymer |
| Neocryl XK176 | Bubbling during thermal cure. | DSM Neoresins | Acrylic copolymer emulsion |

TABLE 1-continued

| Adhesive | Observations | Supplier | Description |
|---|---|---|---|
| Butvar BR | Did not laminate to glass at all. | Solutia Inc. | Poly vinyl butyral |
| Alberdingk LUX 250 | Extensive bubbling during thermal cure. Cohesive failure during peels. | Alberdingk Boley GmbH | Solvent-free, hard-elastic, UV-curable polyurethane dispersion. |
| Alberdingk LUX 515 | Bubbling during thermal cure. Cohesive failure during peels. | Alberdingk Boley GmbH | Aqueous anionic UV-crosslinkable dispersion based on an acrylic acid esters copolymer. |
| Neocryl XK-90 | Bubbling during thermal cure. Non-clean peels at incorrect interface. | DSM Neoresins | Acrylic copolymer emulsion. |
| Alberdingk LUX 3381 | Extensive bubbling during thermal cure. Peels not clean. | Alberdingk Boley GmbH | Aqueous, UV crosslinkable, solvent-free polymer dispersion based on a copolymer of acrylic acid esters. |
| Alberdingk LUX 399 | Some bubbling during thermal cure. | Alberdingk Boley GmbH | Aqueous, anionic, UV-crosslinkable dispersion based on an aliphatic polyurethane & acrylic acid esters copolymer. |
| Alberdingk U8001 | Performed well at 150° C., but bubbling at 180° C. | Alberdingk Boley GmbH | Aqueous, anionic, solvent-free, low viscous dispersion of an aliphatic polyester-polyurethane without free isocyanate groups, (contains triethylamine) |
| Incorez W2205 | Performed very well | Incorez Ltd. | Polyurethane acrylic hybrid dispersion with a polycarbonate backbone |
| Neorad R440 | Cracking during thermal cure. Cohesive failure at peel. | DSM | Aliphatic urethane dispersion |

Example 2

Further analysis was conducted on three coatings from Example 1 which exhibited at least some aspects of the required property profile, together with a coating (Neorad® R440) which did not exhibit the required properties. The following coatings were thus identified:
(i) Neorad® R440
(ii) Alberdingk® Lux 399
(iii) Alberdingk® U8001; and
(iv) Incorez® W2205

Coatings (iii) and (iv) exhibited the best switchability in the experiments of Example 1. Coated films were prepared using these four adhesive compositions and they were analysed by modulated DSC and DMA as described above. The results are presented in FIGS. 1 to 4. The data for the glass transition temperatures (at onset) as measured by modulated DSC is provided in Table 2 below. The reheat conditions were 150° C. for 2 minutes in air.

TABLE 2

| | As received | | Reheat | | ΔTg | ΔTg |
|---|---|---|---|---|---|---|
| Adhesive Coating | Tg Onset (° C.) | Tg End (° C.) | Tg Onset (° C.) | Tg End (° C.) | Onset (° C.) | End (° C.) |
| Neorad ® R440 | −46.05 | −33.61 | −16.16 | +4.91 | 29.89 | 38.52 |
| Alberdingk ® Lux 399 | −47.89 | −34.10 | −17.63 | +10.64 | 30.26 | 44.82 |
| Alberdingk ® U8001 | −50.42 | −43.34 | −50.04 | −43.14 | 0.38 | 0.20 |
| Incorez ® W2205 | −60.20 | −56.44 | −58.07 | −51.65 | 2.13 | 4.79 |

The results demonstrate that the adhesive coatings which showed the most effective switching are those where the change in Tg following heating to high temperatures is less than 15° C. i.e. the Alberdingk® U8001 and the Incorez0 W2205 adhesive coatings.

Example 3

Further analysis of adhesive coatings (i) to (iv) from Example 2 was performed using FTIR-TGA. The samples were analysed as described herein with a heating rate of 10° C./minute using three different final temperatures (180° C., 200° C. and 220° C.) for the 5-minute isothermal hold. Visual inspection of the sample pans after heating showed that the Neorad® R440 adhesive coating had bubbled by 180° C. The Alberdingk® U8001 coating had bubbled by 200° C. The Incorez® W2205 coating exhibited almost no bubbling up to 200° C.

Figure 8:
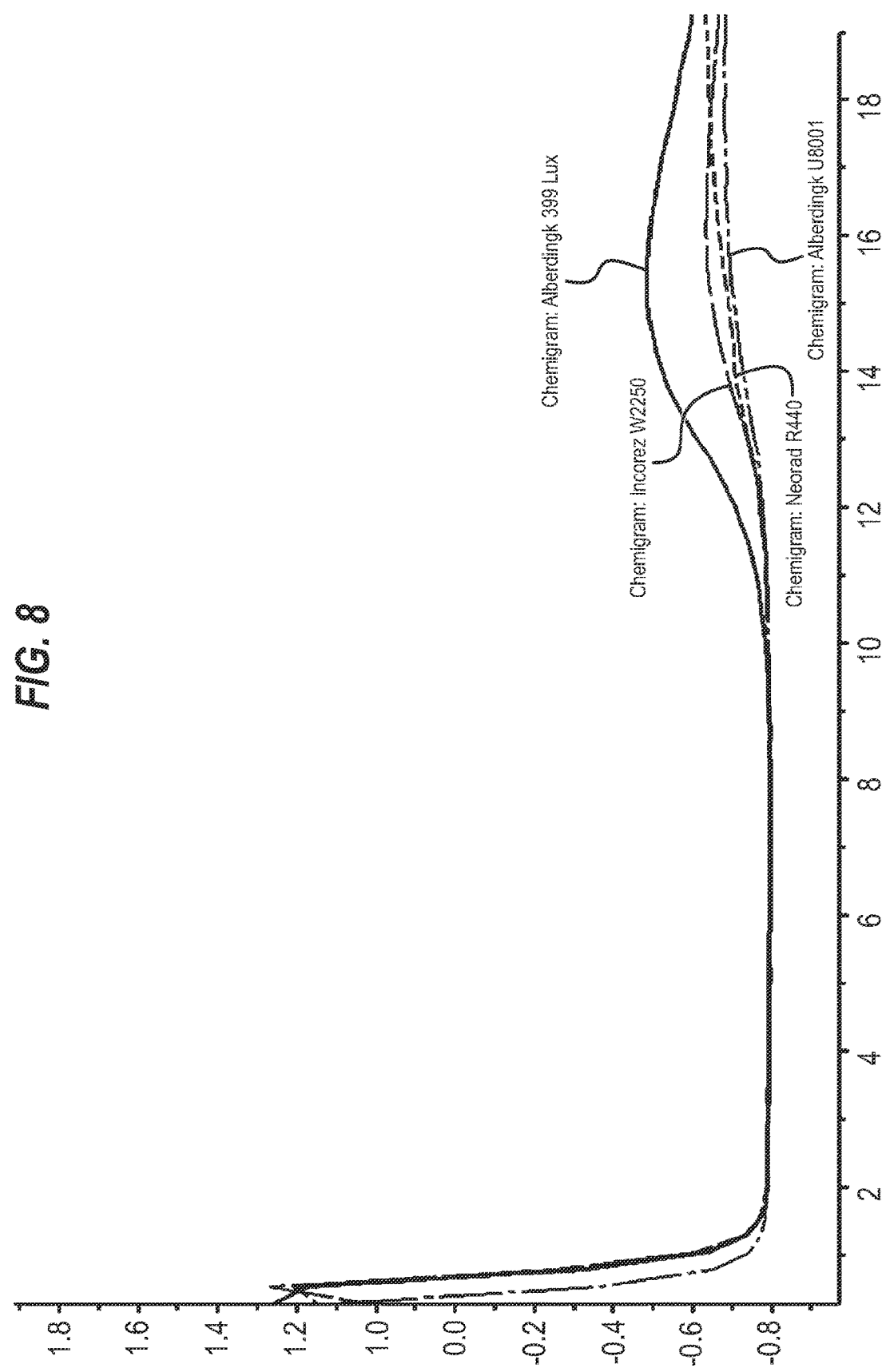
FIG. 8 shows chemigrams for NeoRad® R440, Alberdingk® Lux 399, Alberdingk® U8001 and Incorez® W2205 at a temperature of 180° C.
Figure 9:
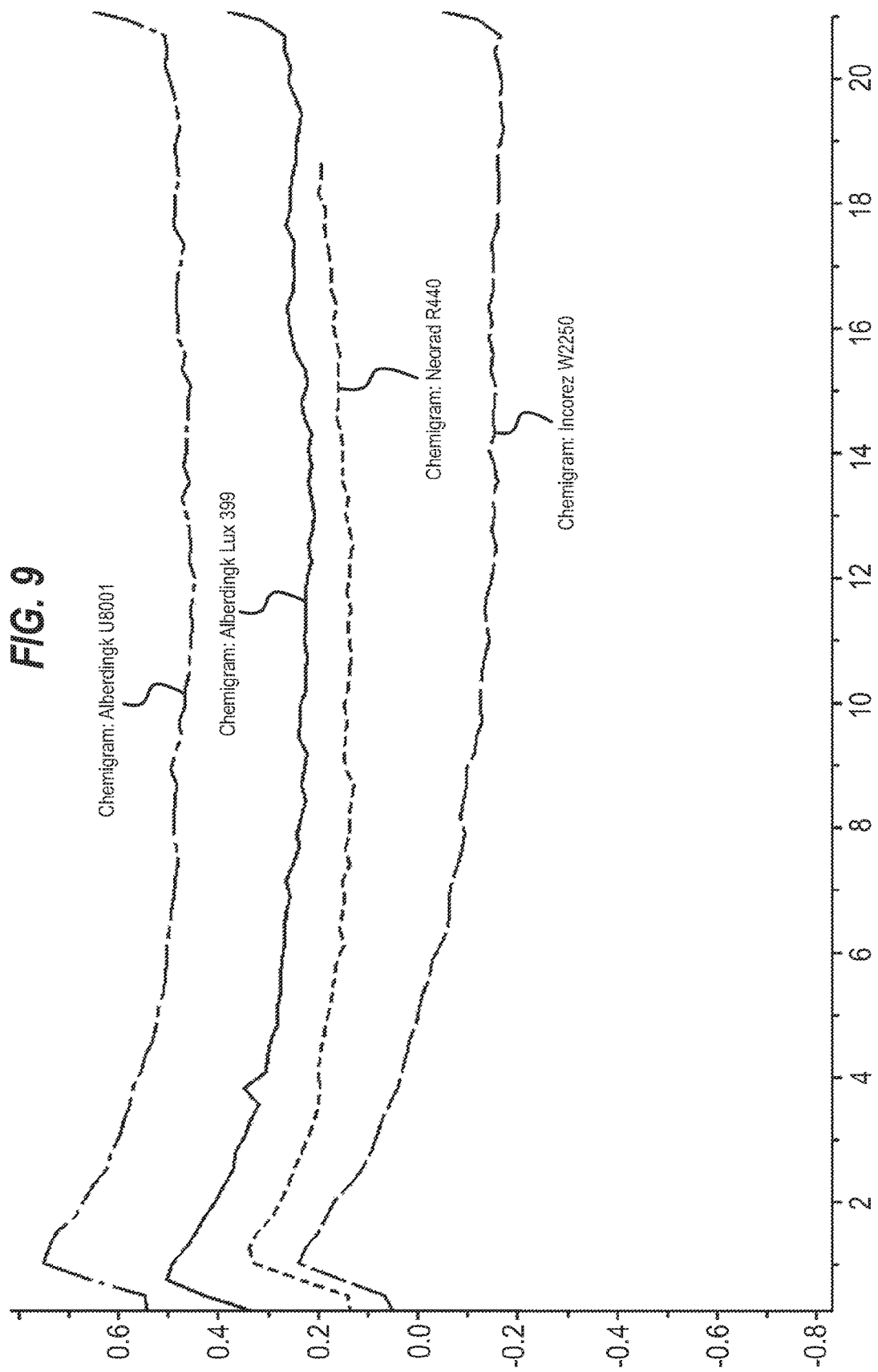
FIG. 9 shows chemigrams for NeoRad® R440, Alberdingk® Lux 399, Alberdingk® U8001 and Incorez® W2205 at a temperature of 200° C.
Figure 10:
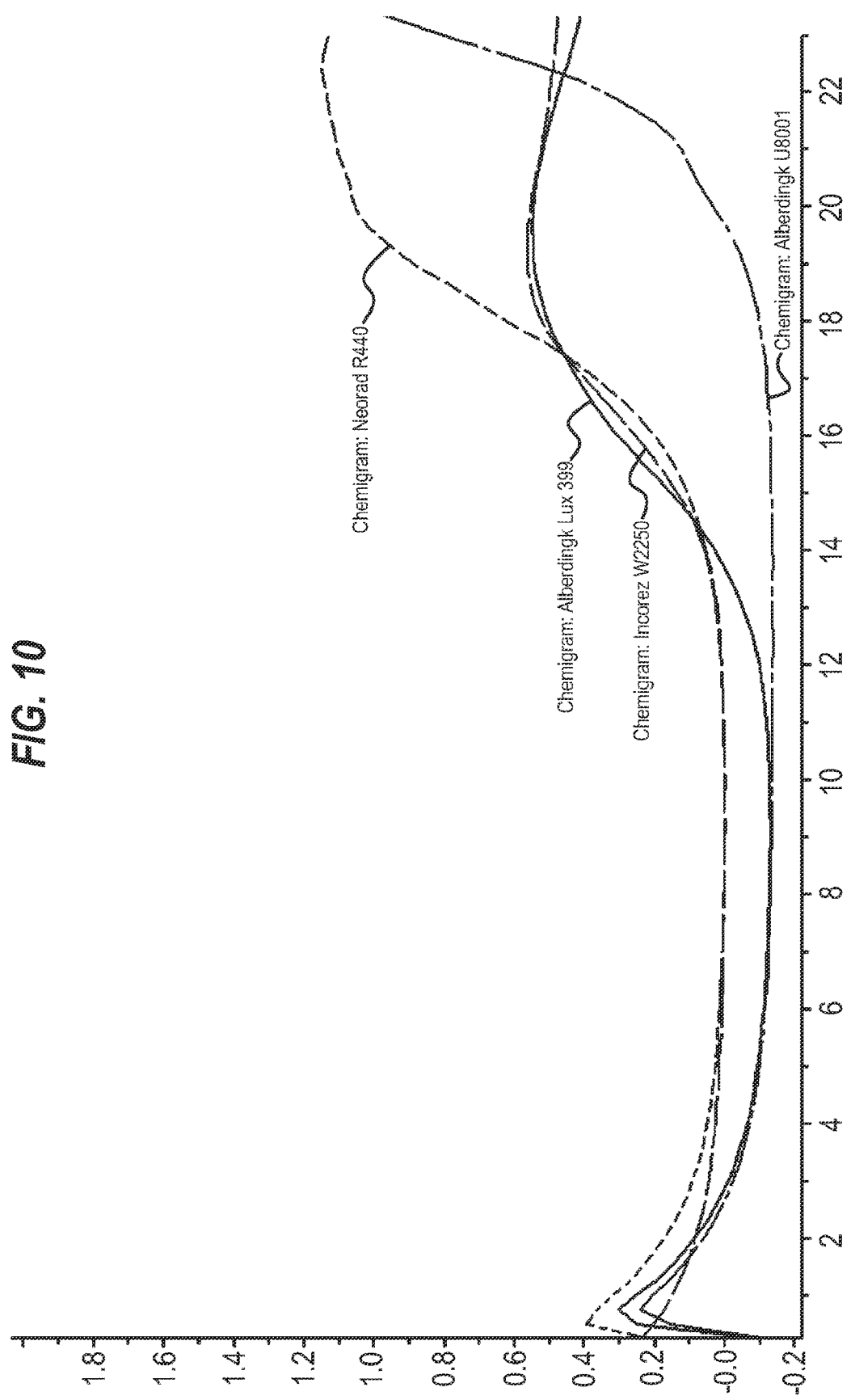
FIG. 10 shows chemigrams for NeoRad® R440, Alberdingk® Lux 399, Alberdingk® U8001 and Incorez® W2205 at a temperature of 220° C.
Figure 11:
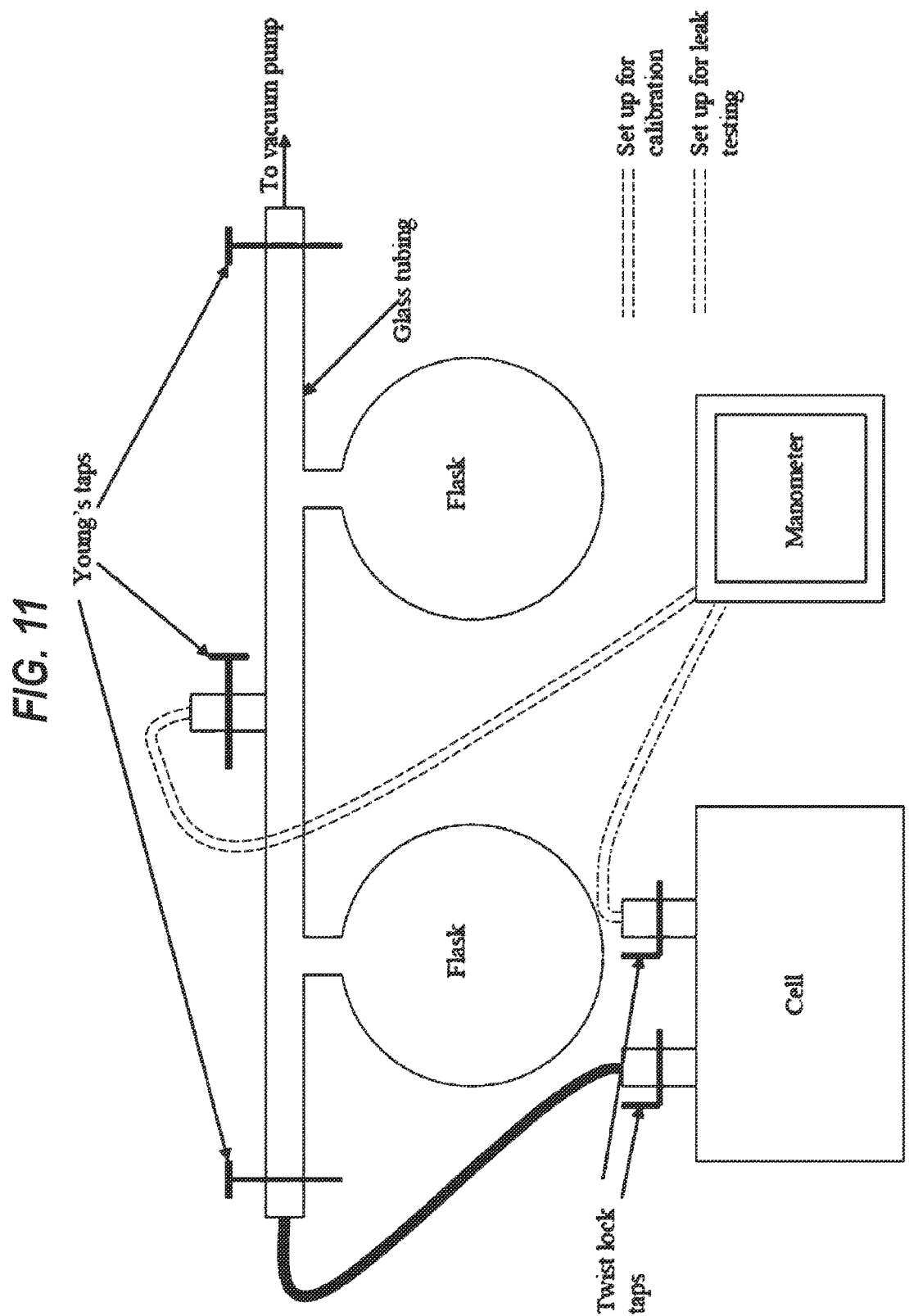
FIG. 11 shows the apparatus used to measure the amount of carbon dioxide evolved in the FTIR-TGA experiments, and the calibration thereof.
Figure 12:
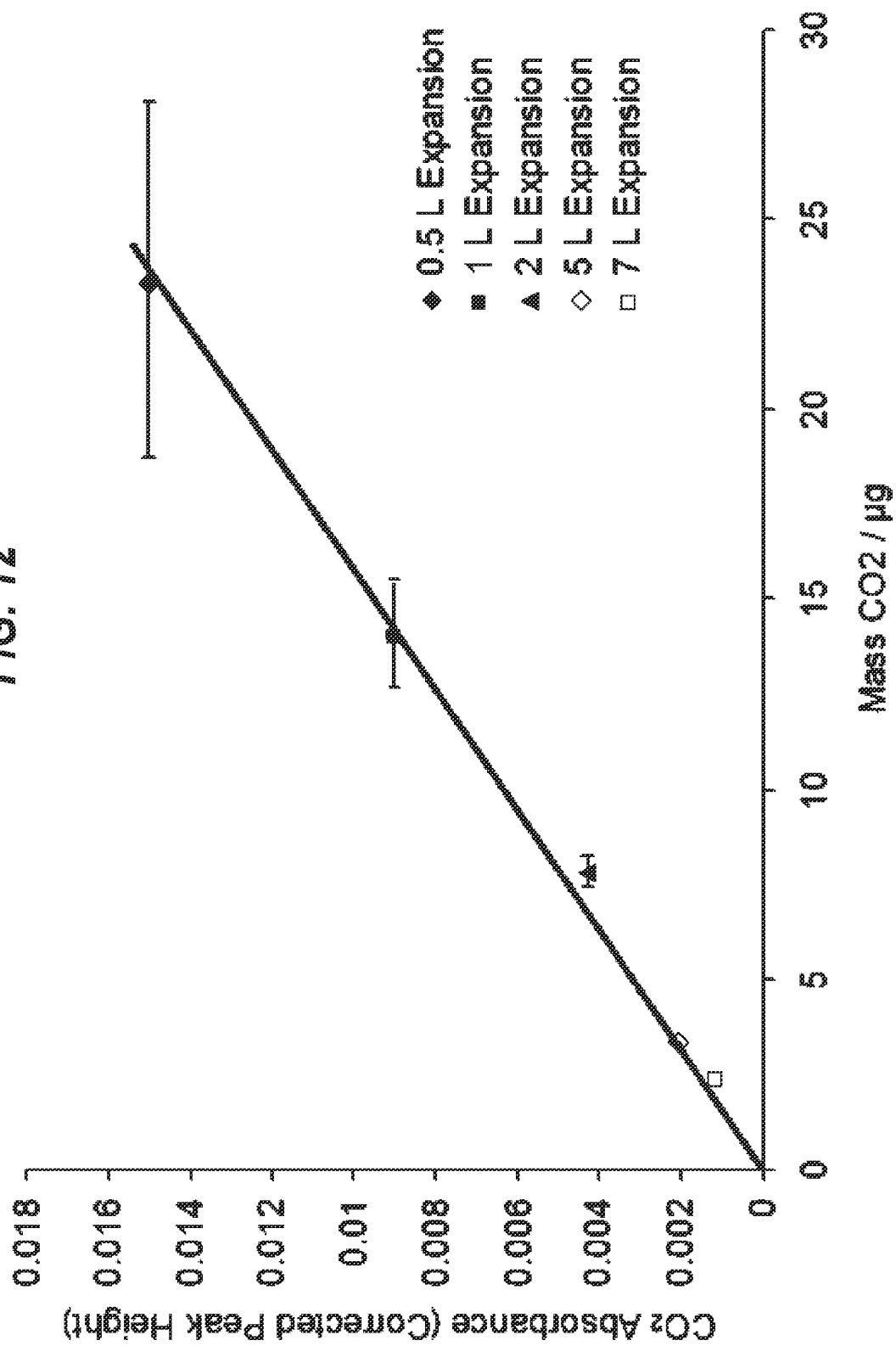
FIG. 12 shows the data collected from the apparatus of FIG. 11 used to calibrate the experiment.

The FTIR-TGA plots and chemigrams obtained are presented in FIGS. 5 to 10. In each spectrum recorded and illustrated in FIGS. 5, 6 and 7 (which used 180, 200 and 220° C. final isothermal holds, respectively), the upper lines correspond to the TGA curves, while the lower lines are the chemigrams of the $CO_2$ region (2400-2200 cm$^{-1}$). The chemigrams are also shown in FIGS. 8, 9 and 10. The spike recorded at 180° C. in the TGA curves is an anomaly and can be ignored. Any spikes observed towards the end of the chemigram sample are associated with opening the furnace and so can be ignored because they are not representative of the sample result. The initial loss which was evident in all of the TGA curves was due to the loss of water from the sample (all samples were made up with distilled water in order to be analysed by FTIR-TGA).

The $CO_2$ peak relative intensity data, as measured by the FTIR-TGA analysis described herein, are presented in Table 3 below.

TABLE 3

| Adhesive composition | Relative intensity of $CO_2$ peak at 180° C. | Relative intensity of $CO_2$ peak at 200° C. | Relative intensity of $CO_2$ peak at 220° C. |
|---|---|---|---|
| Neorad ® R440 | 0.1 | 0.2 | 0.6 |
| Alberdingk ® Lux 399 | 0.2 | 0.3 | 0.5 |
| Alberdingk ® U8001 | 0.1 | 0.5 | 0 |
| Incorez ® W2205 | 0.1 | 0 | 0.5 |

The FTIR-TGA experiments demonstrated that $CO_2$ evolution increases with increasing temperature. In particular, the Neorad® R440 and the Alberdingk® Lux 399 coatings gave off increasing amounts of $CO_2$ as the temperature increased. In addition, for Alberdingk® Lux 399, the onset of $CO_2$ evolution occurred at a much lower starting temperature compared to the other resins. The Alberdingk®

U8001 coating exhibited reasonable performance up to 180° C. but evolved significant amounts of $CO_2$ at 200° C. For Incorez® W2205, the coating exhibits excellent performance within the target temperature range of no more than 200° C. in that only very small amounts of $CO_2$ were evolved. While the Incorez® W2205 coating did exhibit a relatively large % weight loss in the range of 180-220° C., this is due to the evolution of water (as demonstrated by the infra-red spectra of the coating at these temperatures).

The mass (in µg) of carbon dioxide evolved at 18 minutes during the temperature cycle of the FTIR-TGA analysis described herein, as measured for the relatively more intense, higher wavenumber absorption peak at 2364 $cm^{-1}$ of the multiplet observed for the asymmetric stretching absorption of $CO_2$, is presented in Table 4 below.

TABLE 4

| Adhesive composition | Amount of $CO_2$ evolved at 180° C. | Amount of $CO_2$ evolved at 200° C. | Amount of $CO_2$ evolved at 220° C. |
| --- | --- | --- | --- |
| Neorad ® R440 | 31.21 | 36.81 | 31.06 |
| Alberdingk ® Lux 399 | 34.64 | 4.09 | −3.64 |
| Alberdingk ® U8001 | 30.61 | 31.82 | 9.39 |
| Incorez ® W2205 | 27.73 | 32.58 | 15.6 |

The results in Table 4 indicate that the Alberdingk® Lux 399 coating has degraded (or cured) and that the large fall in $CO_2$ with temperature can be attributed to that effect, as supported by the modulated DSC and DMA analysis. The Neorad® R440 continues to generate $CO_2$ during the temperature rise and the significant Tg change in the modulated DSC and DMA analysis shows that there is degradation or other significant change in the system. Both Incorez® W2205 and Alberdingk® U8001 gave superior performance across all temperature ranges, but within the target temperature range of from 150 to 200° C., and specifically at 180° C., the Incorez® W2205 coating exhibited significantly reduced $CO_2$ generation, and therefore provided significantly superior performance.

Example 4

The analytical results for Incorez® W2205 are set out below.
NMR

The carbonyl group-containing species present in Incorez® W2205 are demonstrated as follows. A sample of Incorez® W2205 was dissolved in deuterated pyridine and analysed by NMR techniques. The NMR spectrum demonstrates the presence of N-ethyl pyrrolidone and butyl diglycol solvents in the composition. The NMR spectrum further demonstrates the presence of poly(butylmethacrylate), polycaprolactone, poly(hexamethylenecarbonate) and aliphatic polyurethane. The approximate quantification of the composition based on the distribution of carbonyl species is shown in Table 5 below.

TABLE 5

| Carbonyl type | Mole % |
| --- | --- |
| Polycarbonate: —O—(CO)—O— | 9 |
| Polyurethane: —O—(CO)—NH—R—NH—(CO)—O— | 9 |
| Polycaprolactone: —O—(CO)— | 14 |
| Acrylic: —O—(CO)— | 68 |
| Total C═O integral | 100 |

FTIR/Raman

A film of the adhesive Incorez® W2205 was cast and left to dry overnight on a glass slide at room temperature, and the sample was then subjected to FTIR and Raman analysis. The Raman and FTIR analyses demonstrate that the dried film comprises poly(butylmethacrylate) as a major fraction. No unreacted isocyanate was observed in the dry film.

Inorganic Analysis

Inorganic elemental analysis was carried after drying the adhesive composition at 200° C. for 3 hours. The average % w/w was 2.4% N, 66.4% C and 9.5% H, i.e. an N/C molar ratio of 0.03.

XPS

A drop of the adhesive composition was dried overnight at approximately 40° C. on a piece of clean PET film. The bulk and surface of the dried sample were analysed using XPS and found to have the same composition which means that no detectable macroscopic separation occurred during drying. The XPS analysis confirmed an N/C molar ratio of 0.03.

The invention claimed is:

1. A method for manufacturing an electronic device comprising:
   (a) heating a laminate comprising (i) a polyester film substrate having a first surface and a second surface, (ii) an adhesive coating derived from an aqueous composition comprising an aliphatic polyurethane and (iii) a glass or silicon wafer substrate, wherein the adhesive coating is disposed between the polyester film substrate and the glass or silicon wafer substrate, to a temperature of at least 150° C. for a period of at least two minutes; and
   (b) peeling the polyester film substrate from the glass or silicon wafer substrate to leave the adhesive coating on the glass or silicon wafer substrate.

2. The method according to claim 1 comprising the steps of:
   (c) providing a polyester film comprising (i) a polyester film substrate having a first surface and a second surface and (ii) an adhesive coating derived from an aqueous composition comprising an aliphatic polyurethane wherein said adhesive coating is disposed on a first surface of said polyester film substrate;
   (d) laminating a glass or silicon wafer substrate to the first surface of the polyester film substrate such that the adhesive coating is disposed between the polyester film substrate and the glass or silicon wafer substrate;
   (e) processing the laminate by subjecting it to a temperature of at least 150° C. for a period of at least 2 minutes and disposing one or more electronic components on the second surface of the polyester film substrate; and
   (f) peeling the polyester film substrate from the glass or silicon wafer substrate to leave the adhesive coating on the glass or silicon wafer substrate.

3. The method according to claim 1, wherein following the step of peeling the polyester film substrate from the glass or silicon wafer substrate, the first surface of the polyester film substrate is free from adhesive coating.

4. The method according to claim 1, wherein the electronic device is an electronic display device, or is a photovoltaic cell or a semiconductor device.

5. The method of claim 1, wherein said temperature is no more than 200° C.

6. The method according to claim 1, wherein following the step of peeling the polyester film substrate from the glass or silicon wafer substrate, the polyester film substrate is used as a substrate in said electronic device.

7. The method according to claim 1, wherein the change in the glass transition temperature (at onset) of the aqueous coating after drying and heating to 150° C. for two minutes, is no more than about 15° C., as measured by modulated differential scanning calorimetry (DSC).

8. The method according to claim 1, wherein the adhesive coating exhibits a $CO_2$ peak relative intensity of less than 0.2, wherein $CO_2$ peak relative intensity is defined as the intensity of the $CO_2$ asymmetric stretching absorption in the region of 2200 to 2400 $cm^{-1}$ of the infrared spectrum as measured by FTIR-TGA analysis at 18 minutes during a temperature cycle which consists of heating the adhesive coating at 10° C./min from 40° C. to an isothermal hold at 200° C. for 5 minutes, relative to the intensity of the same $CO_2$ asymmetric stretching absorption of atmospheric air in the same temperature cycle, and/or wherein the adhesive coating evolves no more than 31 µg of $CO_2$ per 25 mg of the adhesive coating as measured by FTIR-TGA analysis of the $CO_2$ asymmetric stretching absorption in the infrared spectrum at 18 minutes during a temperature cycle which consists of heating the adhesive coating at 10° C./min from 40° C. to an isothermal hold at 180° C. for 5 minutes.

9. The method according to claim 1, wherein the aqueous composition further comprises acrylic monomers, wherein the acrylic monomers are selected from the group consisting of methyl methacrylate, ethyl acrylate, isopropyl acrylate, butyl acrylate, butyl methacrylate, pentaerythritol acrylate type materials and hydroxyethyl methacrylate (HEMA).

10. The method according to claim 9, wherein the aqueous composition is a Type 1 urethane-acrylic hybrid polymer dispersion.

11. The method according to claim 9, wherein the aqueous composition is a Type 2 urethane-acrylic hybrid polymer dispersion.

12. The method according to claim 1, wherein the aliphatic polyurethane is derived from an aliphatic diisocyanate and a polyester polyol, and wherein the aliphatic diisocyanate is selected from the group consisting of 1,6-diisocyanatohexane (HDI), 1,4-diisocyanatobutane, 1-isocyanato-5-isocyanato-methyl-3,3,5-trimethyl-cyclohexane or isophorone diisocyanate (PIDI), bis(4-isocyanatocyclohexyl)methane, cyclohexane diisocyanate (CHDI), 2,2,4-trimethylhexamethylene diisocyanate (TMDI), 1,3-bis(isocyanatomethyl)cyclohexane ($H_6XDI$), 1,1' methylenebis(4-isocyanato)-cyclohexane ($H_{12}MDI$) and mixtures thereof and/or the polyester polyol is selected from the group consisting of polycaprolactone diols, polycarbonate diols and mixtures thereof.

13. The method according to claim 1, wherein the aqueous composition further comprises a diluent, wherein the diluent is selected from the group consisting of N-ethyl pyrrolidone (NEP), and butyl diglycol.

14. The method according to claim 1, wherein the adhesive coating has a total nitrogen content in the range from about 2 to about 6 mol%.

15. The method according to claim 1, wherein the ratio of nitrogen to carbon in the adhesive coating is in the range from 0.01 to about 0.05.

16. The method according to claim 1, wherein the aqueous composition from which the adhesive coating is derived comprises aliphatic polyurethane, poly(butylmethacrylate), polycaprolactone and poly(hexamethylene carbonate).

17. The method according to claim 16, wherein the aliphatic polyurethane is present in an amount of about 5 to 15 mol%, the poly(butylmethacrylate) is present in an amount of about 40 to 80 mol%, the polycaprolactone is present in an amount of about 7 to 19 mol%, and the poly-(hexamethylene carbonate) is present at amount of about 5 to 15 mol%, based on the total content of carbonyl group-containing species present in the composition.

18. A laminate comprising (i) a polyester film substrate having a first surface and a second surface, (ii) an adhesive coating derived from an aqueous composition comprising an aliphatic polyurethane, and (iii) a glass or silicon wafer substrate, wherein the adhesive coating is disposed between the polyester film substrate and the glass or silicon wafer substrate, wherein there is a change in the plane of failure of the adhesive coating after heating to a temperature of at least 150° C.

19. The laminate according to claim 18, wherein the adhesion between the polyester film substrate and the adhesive coating is greater than the adhesion between the adhesive coating and the glass or silicon wafer substrate and wherein, following the change in the plane of failure of the adhesive coating, the adhesion between the glass or silicon wafer and the adhesive coating is greater than the adhesion between the adhesive coating and the polyester film substrate.

20. The laminate according to claim 18, wherein the change in the glass transition temperature (at onset) of the aqueous coating after drying and heating to 150° C. for two minutes, is no more than about 15° C. as measured by modulated differential scanning calorimetry (DSC).

21. The laminate according to claim 18, wherein the adhesive coating exhibits a $CO_2$ peak relative intensity of less than 0.2, wherein $CO_2$ peak relative intensity is defined as the intensity of the $CO_2$ asymmetric stretching absorption in the region of 2200 to 2400 $cm^{-1}$ of the infrared spectrum as measured by FTIR-TGA analysis at 18 minutes during a temperature cycle which consists of heating the adhesive coating at 10° C./min from 40° C. to an isothermal hold at 200° C. for 5 minutes, relative to the intensity of the same $CO_2$ asymmetric stretching absorption of atmospheric air in the same temperature cycle, and/or wherein the adhesive coating evolves no more than 31 µg of $CO_2$ per 25 mg of the adhesive coating as measured by FTIR-TGA analysis of the $CO_2$ asymmetric stretching absorption in the infrared spectrum at 18 minutes during a temperature cycle which consists of heating the adhesive coating at 10° C./min from 40° C. to an isothermal hold at 180° C. for 5 minutes.

22. The laminate according to claim 18 wherein the aqueous composition further comprises acrylic monomers, wherein the acrylic monomers are selected from the group consisting of methyl methacrylate, ethyl acrylate, isopropyl acrylate, butyl acrylate, butyl methacrylate, pentaerythritol acrylate type materials and hydroxyethyl methacrylate (HEMA).

23. The laminate according to claim 22, wherein the aqueous composition is a Type 1 urethane-acrylic hybrid polymer dispersion.

24. The laminate according to claim 22, wherein the aqueous composition is a Type 2 urethane-acrylic hybrid polymer dispersion.

25. The laminate according to claim 18, wherein the aliphatic polyurethane is derived from an aliphatic diisocyanate and a polyester polyol, and wherein the aliphatic diisocyanate is selected from the group consisting of 1,6- diisocyanatohexane (HDI), 1,4-diisocyanatobutane, 1-isocyanato-5-isocyanato-methyl-3,3,5-trimethyl-cyclohexane or isophorone diisocyanate (PIDI), bis(4-isocyanatocyclohexyl)methane, cyclohexane diisocyanate (CHDI), 2,2,4-trimethylhexamethylene diisocyanate (TMDI), 1,3-bis(isocyanatomethyl)cyclohexane ($H_6XDI$), 1,1' methylenebis(4-isocyanato)-cyclohexane ($H_{12}MDI$) and mixtures thereof and/or the polyester polyol is selected from the group consisting of polycaprolactone diols, polycarbonate diols and mixtures thereof.

26. The laminate according to claim 18, wherein the aqueous composition further comprises a diluent, wherein the diluent is selected from the group consisting of N-ethyl pyrrolidone (NEP) and butyl diglycol.

27. The laminate according to claim 18, wherein the adhesive coating has a total nitrogen content in the range from about 2 to about 6 mol% %.

28. The laminate according to claim 18, wherein the ratio of nitrogen to carbon in the adhesive coating is in the range from 0.01 to about 0.05.

29. The laminate according to claim 18, wherein the aqueous composition from which the adhesive coating is derived comprises aliphatic polyurethane, poly(butylmethacrylate), polycaprolactone and poly(hexamethylene carbonate).

30. The laminate according to claim 29, wherein the aliphatic polyurethane is present in an amount of about 5 to 15 mol%, the poly(butylmethacrylate) is present in an amount of about 40 to 80 mol%, preferably about 68 mol%, the polycaprolactone is present in an amount of about 7 to 19 mol%, and the poly(hexamethylene carbonate) is present at amount of about 5 to 15 mol%, based on the total content of carbonyl group-containing species present in the composition.

31. A polyester film comprising a polyester film substrate and an adhesive coating, wherein the adhesive coating is derived from an aqueous composition comprising an aliphatic polyurethane and wherein the change in the glass transition temperature at onset ($\Delta Tg$ (onset)) of the adhesive coating after heating to 150° C. for two minutes, is no more than about 15° C. as measured by modulated differential scanning calorimetry (DSC).

32. The film according to claim 31, wherein the adhesive coating exhibits a $CO_2$ peak relative intensity of less than 0.2 wherein $CO_2$ peak relative intensity is defined as the intensity of the $CO_2$ asymmetric stretching absorption in the region of 2200 to 2400 $cm^{-1}$ of the infrared spectrum as measured by FTIR-TGA analysis at 18 minutes during a temperature cycle which consists of heating the adhesive coating at 10° C./min from 40° C. to an isothermal hold at 200° C. for 5 minutes, relative to the intensity of the same $CO_2$ asymmetric stretching absorption of atmospheric air in the same temperature cycle, and/or wherein the adhesive coating evolves no more than 31 μg of $CO_2$ per 25 mg of the adhesive coating as measured by FTIR-TGA analysis of the $CO_2$ asymmetric stretching absorption in the infrared spectrum at 18 minutes during a temperature cycle which consists of heating the adhesive coating at 10° C./min from 40° C. to an isothermal hold at 180° C. for 5 minutes.

33. The film according to claim 31, wherein the aqueous composition further comprises acrylic monomers, wherein the acrylic monomers are selected from the group consisting of methyl methacrylate, ethyl acrylate, isopropyl acrylate, butyl acrylate, butyl methacrylate, pentaerythritol acrylate type materials and hydroxyethyl methacrylate (HEMA).

34. The film according to claim 33, wherein the aqueous composition is a Type 1 urethane-acrylic hybrid polymer dispersion.

35. The film according to claim 33, wherein the aqueous composition is a Type 2 urethane-acrylic hybrid polymer dispersion.

36. The film according to claim 31, wherein the aliphatic polyurethane is derived from an aliphatic diisocyanate and a polyester polyol, and wherein the aliphatic diisocyanate is selected from the group consisting of 1,6-diisocyanatohexane (HDI), 1,4-diisocyanatobutane, 1-isocyanato-5-isocyanato-methyl-3,3,5-trimethyl-cyclohexane or isophorone diisocyanate (PIDI), bis(4-isocyanatocyclohexyl)methane, cyclohexane diisocyanate (CHDI), 2,2,4-trimethylhexamethylene diisocyanate (TMDI), 1,3-bis(isocyanatomethyl)cyclohexane ($H_6XDI$), 1,1' methylenebis(4-isocyanato)-cyclohexane ($H_{12}MDI$) and mixtures thereof and/or the polyester polyol is selected from the group consisting of polycaprolactone diols, polycarbonate diols and mixtures thereof.

37. The film according to claim 31, wherein the aqueous composition further comprises a diluent, wherein the diluent is selected from the group consisting of M-ethyl pyrrolidone (NEP) and butyl diglycol.

38. The film according to claim 31, wherein the adhesive coating has a total nitrogen content in the range from about 2 to about 6 mol%.

39. The film according to claim 31, wherein the ratio of nitrogen to carbon in the adhesive coating is in the range from 0.01 to about 0.05.

40. The film according to claim 31, wherein the aqueous composition from which the adhesive coating is derived comprises aliphatic polyurethane, poly(butylmethacrylate), polycaprolactone and poly(hexamethylene carbonate).

41. The film according to claim 40, wherein the aliphatic polyurethane is present in an amount of about 5 to 15 mol%, the poly(butylmethacrylate) is present in an amount of about 40 to 80 mol%, the polycaprolactone is present in an amount of about 7 to 19 mol%, and the poly(hexamethylene carbonate) is present at amount of about 5 to 15 mol%, based on the total content of carbonyl group-containing species present in the composition.

42. A polyester film comprising a polyester film substrate and an adhesive coating, wherein the adhesive coating is derived from an aqueous composition comprising an aliphatic polyurethane and wherein the adhesive coating exhibits a $CO_2$ peak relative intensity of less than 0.2, wherein $CO_2$ peak relative intensity is defined as the intensity of the $CO_2$ asymmetric stretching absorption in the region of 2200 to 2400 $cm^{-1}$ of the infrared spectrum as measured by FTIR-TGA analysis at 18 minutes during a temperature cycle which consists of heating the adhesive coating at 10° C./min from 40° C. to an isothermal hold at 200° C. for 5 minutes, relative to the intensity of the same $CO_2$ asymmetric stretching absorption of atmospheric air in the same temperature cycle, and/or wherein the adhesive coating evolves no more than 31 μg of $CO_2$ per 25 mg of the adhesive coating as measured by FTIR-TGA analysis of the $CO_2$ asymmetric stretching absorption in the infrared spectrum at 18 minutes during a temperature cycle which consists of heating the adhesive coating at 10° C./min from 40° C. to an isothermal hold at 180° C. for 5 minutes.

43. The film according to claim 42, wherein the aqueous composition further comprises acrylic monomers, wherein the acrylic monomers are selected from the group consisting of methyl methacrylate, ethyl acrylate, isopropyl acrylate, butyl acrylate, butyl methacrylate, pentaerythritol acrylate type materials and hydroxyethyl methacrylate (HEMA).

44. The film according to claim 43, wherein the aqueous composition is a Type 1 urethane-acrylic hybrid polymer dispersion.

45. The film according to claim 44, wherein the aqueous composition is a Type 2 urethane-acrylic hybrid polymer dispersion.

46. The film according to claim 42, wherein the aliphatic polyurethane is derived from an aliphatic diisocyanate and a polyester polyol, and wherein the aliphatic diisocyanate is selected from the group consisting of 1,6-diisocyanato-hexane (HDI), 1,4-diisocyanatobutane, 1-isocyanato-5-isocyanato-methyl-3,3,5-trimethyl-cyclohexane or isophorone diisocyanate bis(4-isocyanatocyclohexyl)methane, cyclohexane diisocyanate (CHDI), 2,2,4-trimethylhexamethylene diisocyanate (TMDI), 1,3-bis(isocyanatomethyl)cyclohexane ($H_6$XDI), 1,1' methylenebis(4-isocyanato)-cyclohexane ($H_{12}$MDI) and mixtures thereof and/or the polyester polyol is selected from the group consisting of polycaprolactone diols, polycarbonate diols and mixtures thereof.

47. The film according to claim 42, wherein the aqueous composition further comprises a diluent, preferably wherein the diluent is selected from the group consisting of N-ethyl pyrrolidone (NEP) and butyl diglycol.

48. The film according to claim 42, wherein the adhesive coating has a total nitrogen content in the range from about 2 to about 6 mol%.

49. The film according to claim 42, wherein the ratio of nitrogen to carbon in the adhesive coating is in the range from 0.01 to about 0.05.

50. The film according to claim 42, wherein the aqueous composition from which the adhesive coating is derived comprises aliphatic polyurethane, poly(butylmethacrylate), polycaprolactone and poly(hexamethylene carbonate).

51. The film according to claim 50, wherein the aliphatic polyurethane is present in an amount of about 5 to 15 mol%, the poly(butylmethacrylate) is present in an amount of about 40 to 80 mol%, the polycaprolactone is present in an amount of about 7 to 19 mol%, and the poly(hexamethylene carbonate) is present at amount of about 5 to 15 mol%, based on the total content of carbonyl group-containing species present in the composition.

* * * * *

UNITED STATES PATENT AND TRADEMARK OFFICE
CERTIFICATE OF CORRECTION

| | | |
|---|---|---|
| PATENT NO. | : 10,442,959 B2 | Page 1 of 1 |
| APPLICATION NO. | : 15/570766 | |
| DATED | : October 15, 2019 | |
| INVENTOR(S) | : Julian N. Robinson et al. | |

It is certified that error appears in the above-identified patent and that said Letters Patent is hereby corrected as shown below:

In the Claims

In Column 27, Line 52, in Claim 12:
"1,1′ methylenebis(4-isocyanato)-cyclohexane" should read --1,1′ methylenebis(4-isocyanato)cyclohexane--.

In Column 28, Line 8, in Claim 17:
"poly-(hexamethylene carbonate)" should read --poly(hexamethylene carbonate)--.

In Column 29, Line 7, Claim 25:
"1,1′ methylenebis(4-isocyanato)-cyclohexane" should read --1,1′ methylenebis(4-isocyanato)cyclohexane--.

In Column 29, Line 17, in Claim 27:
"6 mol% %" should read --6 mol%--.

In Column 30, Line 16, Claim 36:
"1,1′ methylenebis(4-isocyanato)-cyclohexane" should read --1,1′ methylenebis(4-isocyanato)cyclohexane--.

In Column 30, Line 23, in Claim 37:
"M-ethyl pyrrolidone (NEP)" should read --N-ethyl pyrrolidone (NEP)--.

In Column 31, Line 15, in Claim 46:
"diisocyanate" should read --diisocyanate (PIDI),--.

In Column 31, Line 18, in Claim 46:
"1,1′ methylenebis(4-isocyanato)-cyclohexane" should read --1,1′ methylenebis(4-isocyanato)cyclohexane--.

Signed and Sealed this
Thirty-first Day of December, 2019

Andrei Iancu
*Director of the United States Patent and Trademark Office*